US007956854B2

(12) United States Patent
Hashimoto

(10) Patent No.: US 7,956,854 B2
(45) Date of Patent: Jun. 7, 2011

(54) DISPLAY APPARATUS, DATA LINE DRIVER, AND DISPLAY PANEL DRIVING METHOD

(75) Inventor: Yoshiharu Hashimoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 779 days.

(21) Appl. No.: 11/485,392

(22) Filed: Jul. 13, 2006

(65) Prior Publication Data

US 2007/0013573 A1 Jan. 18, 2007

(30) Foreign Application Priority Data

Jul. 14, 2005 (JP) ................................ 2005-206001
Dec. 22, 2005 (JP) ................................ 2005-370309

(51) Int. Cl.
*H03M 1/12* (2006.01)

(52) U.S. Cl. ....................................................... 345/204

(58) Field of Classification Search .................. 345/204
See application file for complete search history.

(56) References Cited

U.S. PATENT DOCUMENTS

| | | | | |
|---|---|---|---|---|
| 4,285,012 | A * | 8/1981 | Ohara et al. | 358/496 |
| 4,864,182 | A * | 9/1989 | Fujioka et al. | 315/169.3 |
| 5,973,660 | A * | 10/1999 | Hashimoto | 345/98 |
| 6,049,321 | A * | 4/2000 | Sasaki | 345/99 |
| 6,271,816 | B1 * | 8/2001 | Jeong et al. | 345/87 |
| 7,098,881 | B2 * | 8/2006 | Nitta et al. | 345/89 |
| 7,215,311 | B2 * | 5/2007 | Kim | 345/98 |
| 7,375,712 | B2 * | 5/2008 | Sasaki | 345/96 |
| 7,816,949 | B2 * | 10/2010 | Ishikawa | 326/86 |
| 2003/0146890 | A1 * | 8/2003 | Sasaki | 345/87 |
| 2003/0174119 | A1 * | 9/2003 | Nishi et al. | 345/100 |
| 2004/0145583 | A1 * | 7/2004 | Morita | 345/211 |
| 2006/0022929 | A1 * | 2/2006 | Hashimoto et al. | 345/96 |
| 2006/0232542 | A1 * | 10/2006 | Nishi et al. | 345/98 |
| 2008/0018510 | A1 * | 1/2008 | Huang | 341/143 |

FOREIGN PATENT DOCUMENTS

| | | |
|---|---|---|
| CN | 1444201 | 9/2003 |
| JP | 8-87248 | 4/1996 |
| JP | 9-179095 | 7/1997 |
| JP | 10-062744 | 3/1998 |
| JP | 10-62744 | 3/1998 |
| JP | 10-153986 | 6/1998 |
| JP | 10-222130 | 8/1998 |
| JP | 2001-196918 | 7/2001 |
| JP | 2001-255857 | 9/2001 |
| JP | 2001-515225 | 9/2001 |
| JP | 2002-229525 | 8/2002 |
| JP | 2002-268613 | 9/2002 |
| JP | 2003-271105 | 9/2003 |
| JP | 2004-184840 | 7/2004 |

* cited by examiner

*Primary Examiner* — Bipin Shalwala
*Assistant Examiner* — Afroza Chowdhury
(74) *Attorney, Agent, or Firm* — McGinn Intellectual Property Law Group, PLLC

(57) ABSTRACT

A display apparatus includes a display panel containing data lines; a driving circuit configured to generate a data signal in response to a first pixel data of k (k is an natural number) bits and to supply the data signal to one of the data lines; and a capacitor. A switch circuit connects or disconnects the data line to or from the capacitor in response to upper m bits (m is a natural number smaller than k) of the first pixel data.

14 Claims, 14 Drawing Sheets

1ST HORIZONTAL PERIOD
2ND HORIZONTAL PERIOD
STB
POL
C/D
SW31, 32
SW41
SW42
SW33
SW34
X1
X2
on
NEUTRALIZATION
COLLECTION
NO RE-USE
NO COLLECTION
RE-USE
Vc
Vd

DISPLAY APPARATUS, DATA LINE DRIVER, AND DISPLAY PANEL DRIVING METHOD

BACKGROUND OF THE INVENTION

1. Field of the Invention

The present invention relates to a display apparatus, a data line driver, and a method for driving a display panel. More specifically, the present invention relates to a technique for collecting and re-using charges accumulated in a data line of a display panel, to thereby reduce the consumed power of a display apparatus.

2. Description of the Related Art

A matrix type display panel on which pixels are arranged in a matrix is a display device of a most typical display apparatus. Typical examples of the matrix display panel include a liquid crystal display (LCD) panel and an organic light emitting diode (OLED) panel. Generally, the matrix type display panel is provided with scan lines each for selecting a pixel row and data lines, to each of which a data signal is supplied based on a pixel gradation. The pixels are arranged at respective positions at which the scan lines and the data lines intersect each other.

Most of power consumption of such a display apparatus is a power used for driving the data lines of the display panel. This is because a capacitance of each data line is inevitably large. The length of each data line needs to be increased according to a size of the display panel. However, an increase in the length of the data line causes an increase in the capacitance of the data line. As a result, the power necessary to drive the data line is undesirably increased. The increase in the power for driving the data line is a serious disadvantage particularly for a liquid crystal display apparatus using an LCD panel. The reason is as follows. Generally, for the liquid crystal display apparatus, an inversion driving method of inverting a polarity of a data signal applied to a pixel is adopted to suppress deterioration of liquid crystal material for the pixels. In other words, pixels are AC-driven. Typically, in whichever a row direction (a scan line direction) or a column direction (a data line direction), a polarity of a data signal supplied to a pixel adjacent to one pixel is inverted. This inversion driving is referred to as “dot inversion driving”. However, to invert the polarity of the data signal, it is necessary to invert the polarity of a voltage of the data line with respect to a reference voltage. This disadvantageously increases the power for driving the data line.

A technique for collecting charges accumulated on the data line in a charge accumulation capacitor is one of effective techniques for reducing the consumed power. Japanese Laid Open Patent Publication (JP-P2001-515225A) discloses a technique for moving charges accumulated in each data line to a charge collecting capacitor, and thereby collecting the charges in the charge collection capacitor in a liquid crystal display apparatus that adopts the dot inversion driving method. FIG. 1 is a circuit diagram showing a configuration of the above conventional liquid crystal display apparatus. In FIG. 1, data lines are driven by even-number column drivers 104 and odd-number column drivers 105. The data lines driven by the even-number column drivers 104 are connected to an even-number reservoir line 216 through even-number coupling transistors 214. The data lines driven by the odd-number column drivers 105 are connected to an odd-number reservoir line 217 through odd-number coupling transistors 215. The liquid crystal display apparatus includes a positive polarity capacitor 220 and a negative polarity capacitor 221 that accumulate charges collected from the data lines. The even-number reservoir line 216 or the odd-number reservoir line 217 can be connected to a desired one of the positive polarity capacitor 220 and the negative polarity capacitor 221 through straight transistors 230 or cross transistors 240. Further, a neutralizing transistor 235 is connected between the even-number reservoir line 216 and the odd-number reservoir line 217. The neutralizing transistor 235 is used to short-circuit the even-number reservoir line 216 and the odd-number reservoir line 217. A reference numeral 110 denotes a capacitance of each data line.

FIGS. 2A to 2D are timing charts showing an operation of the well-known liquid crystal display apparatus disclosed in the above conventional example. FIGS. 2A to 2D show one example of changes in voltage of the data line connected to the even-number column driver 104 and the data line connected to the odd-number column driver 105, respectively. A polarity of each data line is determined in response to a polarity signal POL. In the example of FIGS. 2A to 2D, in a first horizontal period in which the polarity signal POL is at low level, the data line connected to the even-number column driver 104 is driven to a positive polarity voltage relative to the reference voltage. In addition, the data line connected to the odd-number column driver 105 is driven to a negative polarity voltage relative to the reference voltage.

At the end of driving the data lines in the first horizontal period, charges accumulated in the respective data lines are collected in the positive polarity capacitor 220 and the negative polarity capacitor 221. Specifically, the even-number coupling transistor 214 and the odd-number transistor 215 are turned on. The data lines connected to the even-number column drivers 104 and the data lines connected to the odd-number column drivers 105 are thereby connected to the even-number reservoir line 216 and the odd-number reservoir line 217, respectively. Further, the straight transistor 230 is turned on, whereby the even-number reservoir line 216 and the odd-number reservoir line 217 are connected to the positive polarity capacitor 220 and the negative polarity capacitor 221, respectively. As a result, the charges accumulated in the data lines connected to the even-number column drivers 104 are collected in the positive polarity capacitor 220. In addition, the charges accumulated in the data lines connected to the odd-number drivers 105 are collected in the negative polarity capacitor 221. After collection of the charges, the straight transistors 230 are turned off, and the even-number reservoir line 216 and the odd-number reservoir line 217 are disconnected from the positive polarity capacitor 220 and the negative polarity capacitor 221, respectively.

Next, the neutralizing transistor 235 is turned on, and the even-number reservoir line 216 is short-circuited to the odd-number reservoir line 217. The charges of the data lines are thereby neutralized.

In a second horizontal period, polarities of the respective data lines are inverted in response to inversion of the polarity signal POL. Namely, in the second horizontal period, the data lines connected to the even-number column drivers 104 are driven to a negative polarity voltage. In addition, the data lines connected to the odd-number column drivers 105 are driven to a positive polarity voltage. Prior to driving the data lines, the charges accumulated in the positive polarity capacitor 220 and the negative polarity capacitor 221 are re-used for driving the data lines. Specifically, the cross transistors 240 are turned on in response to activation of a latch signal STB. The even-number reservoir line 216 is connected to the negative polarity capacitor 221, and the odd-number reservoir line 217 is connected to the positive polarity capacitor 220. The charges of the positive polarity capacitor 220 and those of the negative polarity capacitor 221 are thereby moved to the data lines connected to the odd-number column drivers 105 and to the data lines connected to the even-number column drivers 104, respectively. That is, the charges accumulated in the positive polarity capacitor 220 and those accumulated in the negative polarity capacitor 221 are re-used to drive the data lines connected to the odd-number column drivers 105 and the data lines connected to the even-number column drivers 104, respectively.

As can be seen, by collecting the charges accumulated on the data lines into the capacitors and re-using the charges, the liquid crystal display apparatus shown in FIG. 1 can effectively reduce the power consumption.

The Japanese Laid Open Patent Publication (JP-P2001-515225A) also discloses the following technique. In order to perform charge accumulation more efficiently, i.e., perform collection and re-using of the charges efficiently, the liquid crystal display apparatus also includes the even-number coupling transistors 214 and the odd-number coupling transistors 215 for connecting specific data lines to corresponding reservoir lines 216 or 217 by using corresponding pixel data, and a decision circuit that decides whether and when to assert a neutralizing signal (in the above reference, FIG. 6 and paragraph [0067]). The Japanese Laid Open Patent Publication (JP-P2001-515225A) further discloses a technique for performing the charge accumulation further efficiently by using not only the pixel data but also additional information indicating voltage levels of the respective capacitors (in the above reference, FIG. 7 and paragraph [0068]).

However, the Japanese Laid Open Patent Publication (JP-P2001-515225A) discloses only abstractly an operation performed by the decision circuit for further efficiently performing collection and re-using of charges. In addition, the Japanese Laid Open Patent Publication (JP-P2001-515225A) fails to disclose how the decision circuit processes the pixel data. Further, the Japanese Laid Open Patent Publication (JP-P2001-515225A) fails to disclose in which case the charge collection and re-using are performed in detail. According to studies of the inventor of the present invention, optimization of an operation for selecting a data line for which the charges are collected and re-used is important for simplifying the circuit.

SUMMARY OF THE INVENTION

In an aspect of the present invention, a display apparatus includes a display panel containing data lines; a driving circuit configured to generate a data signal in response to a first pixel data of k (k is an natural number) bits and to supply the data signal to one of the data lines; a capacitor; and a switch circuit configured to connect or disconnect the data line to or from the capacitor in response to upper m bits (m is a natural number smaller than k) of the first pixel data.

Here, it is preferable that the m meets the following equation:

$$1 \leqq m \leqq k/2,$$

and it is more preferable that the m is 1.

Also, the driving circuit may drive the data line in response to the first pixel data in a drive period of a given horizontal period, and the switch circuit may connect the data line with the capacitor in a collection period subsequent to the drive period of the horizontal period.

In this case, a second pixel data of k bits may be supplied to the driving circuit in a next horizontal period subsequent to the horizontal period. The switch circuit may connect or disconnect the data line to or from the capacitor in response to upper n (n is a natural number smaller than k) bits of the second pixel data in a re-use period of the next horizontal period, and the driving circuit may drive the data line in response to the second pixel data in the drive period after the re-use period of the next horizontal period. In this case, it is preferable that the following equation is met:

$$n>m.$$

Also, the display apparatus may further include a measuring unit configured to measure a voltage of the capacitor. The switch circuit may connect or disconnect the data lines to or from the capacitor in response to the measured voltage of the capacitor.

Also, the display panel may be in a white displays when a signal level of the data signal is the lowest, and in a black displays when the signal level of the data signal is the highest. The switch circuit may disconnect the data line from the capacitor when the upper m bits of the first pixel data have a value corresponding to a white display, and connect the data line to the capacitor when the upper m bits of the first pixel data have a value corresponding to the black display.

Also, the display panel may be in a black display when the signal level of the data signal is the lowest, and in a white display when the signal level of the data signal is the highest. The switch circuit may disconnect the data line from the capacitor when the upper m bits of the first pixel data is a value corresponding to the black display, and connect the data line to the capacitor when the upper m bits of the first pixel data is a value corresponding to the white display.

Also, the switch circuit may connect or disconnect the data line to or from the capacitor in response to the upper m bits ($m<k$) of the first pixel data and a polarity signal.

In another aspect of the present invention, a method of driving a display panel is achieved by driving a data line of the display panel in response to k bits of a first pixel data; by determining whether to collect an electric charge from the data line in response to upper m bits ($m<k$) of the first pixel data; and by connecting the data line with a capacitor electrically when collection of the electric charge is determined.

Here, the method may be achieved by further determining whether to re-use the electric charge to the data line in response to upper n bit ($n<k$) a second pixel data of k bits; connecting the data line with the capacitor electrically when the re-use of the electric charge is determined; and driving the data line in response to the second pixel data.

Also, a still another aspect of the present invention, a data line driver which drives a data line of a display panel, includes a positive polarity driving circuit configured to operate in a first voltage range between a reference voltage and a first voltage higher than the reference voltage to output to a first node, a positive polarity data signal with respect to the reference voltage; and a negative polarity driving circuit configured to operate in a second voltage range between the reference voltage and a second voltage lower than the reference voltage to output to a second node, a negative polarity data signal with respect to the reference voltage. A first collection switch is provided between the first node and a first collection line; and a second collection switch is provided between the second node and a second collection line. Electric charges accumulated on the data line are transferred by controlling the first and second collection switches.

Here, the data line driver may further include a switching circuit configured to operate in a third voltage range higher than the first voltage and lower than the second voltage to connect the first node and the second node and to output the data signals having different polarities to adjacent output terminals.

Also, the data line driver may further include first and second precharge switches provided between the reference voltage line and the first and second nodes, respectively.

Also, the data line driver may further include diode elements provided between the reference voltage line and the first and second nodes, respectively.

Also, the switching circuit may short-circuit the first node and the second node.

Also, the reference voltage may be a system ground of the display apparatus.

Also, the first collection switch may operate in the first voltage range, and the second collection switch operates in the second voltage range.

Also, the first and second collection switches may connect or disconnect the data line to or from the first and second collection lines electrically in response to upper m bits (m<k) of an image data of k bits.

Also, the first precharge switch may operate in the first voltage range, and the second precharge switch operates in the second voltage range.

Also, in another aspect of the present invention, a display apparatus include a display panel containing a first data line and a second data line; a driving circuit; a first capacitance element; a second capacitance element; and a switch circuit. The driving circuit generates a first data signal having a first polarity in response to a first pixel data of k bits and generates a second data signal having a second polarity complementary to the first polarity in response to a second pixel data of the k bits. The switch circuit supplies the first data signal to one of the first data line and the second data line and supplies the second data signal to the other data line. The switch circuit connects the one data line to the first capacitor in response to upper m bits (m<k) of the first pixel data and connects the other data line with the second capacitor in response to upper m bits of the second pixel data.

Also, the display apparatus may further include a reference voltage line having a predetermined voltage. The switch circuit connects the first data line and the second data line with the reference voltage line in response to a control signal.

Also, in another aspect of the present invention, a data line driver which drives a data line of a display panel, includes a driving circuit configured to generate a data signal in response to a first pixel data of k bits and to supply the data signal to the data line; a charge collection line connected with a capacitor; and a switch circuit. The switch circuit connects the data line to the charge collection line in response to upper m bits (m<k) of the first pixel data or separates the data line from the charge collection line.

DESCRIPTION OF THE PREFERRED EMBODIMENTS

Figure 1:
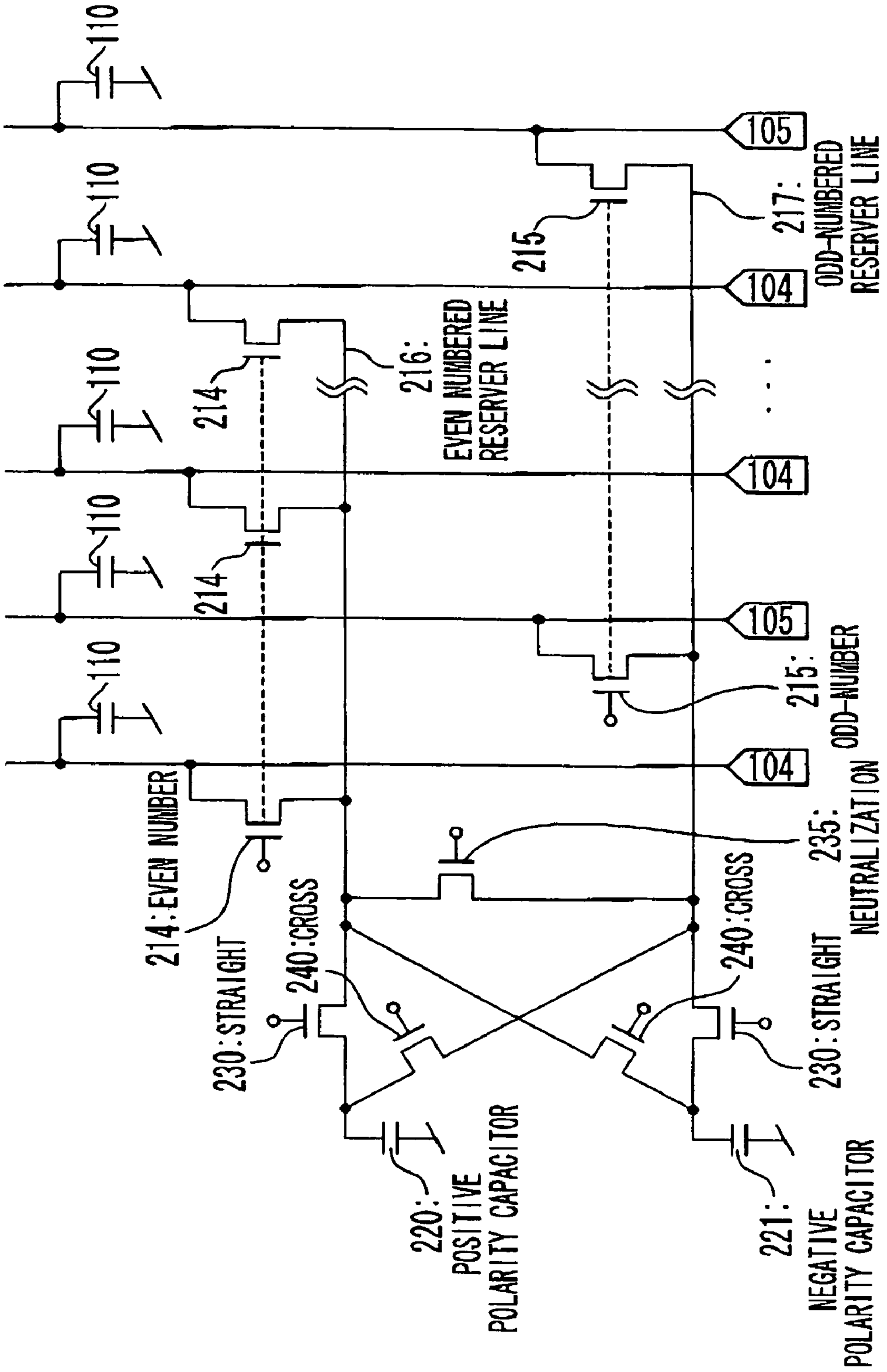
Fig. 1 PRIOR ART
FIG. 1 is a circuit diagram showing a configuration of a conventional liquid crystal display apparatus.
Figure 2:
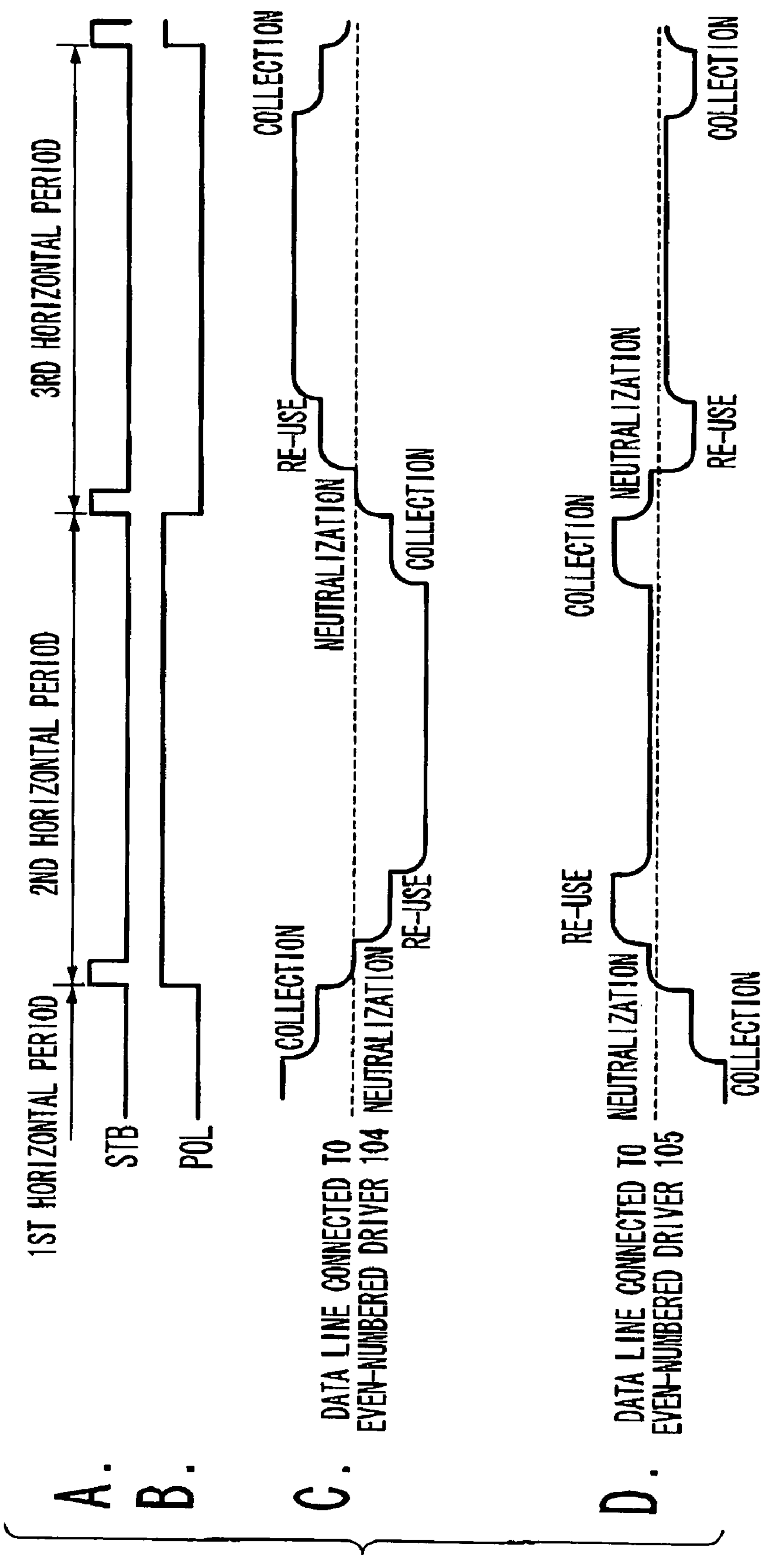
Fig. 2 PRIOR ART
FIGS. 2A to 2D are timing charts showing an operation of the conventional liquid crystal display apparatus.

Hereinafter, a display apparatus using a data line driver of the present invention will be described in detail with reference to the attached drawings. In the drawings, same, similar or corresponding components are assigned with same or similar reference numerals or symbols, respectively.

[Configuration of Display Apparatus with Data Line Driver]

Figure 3:
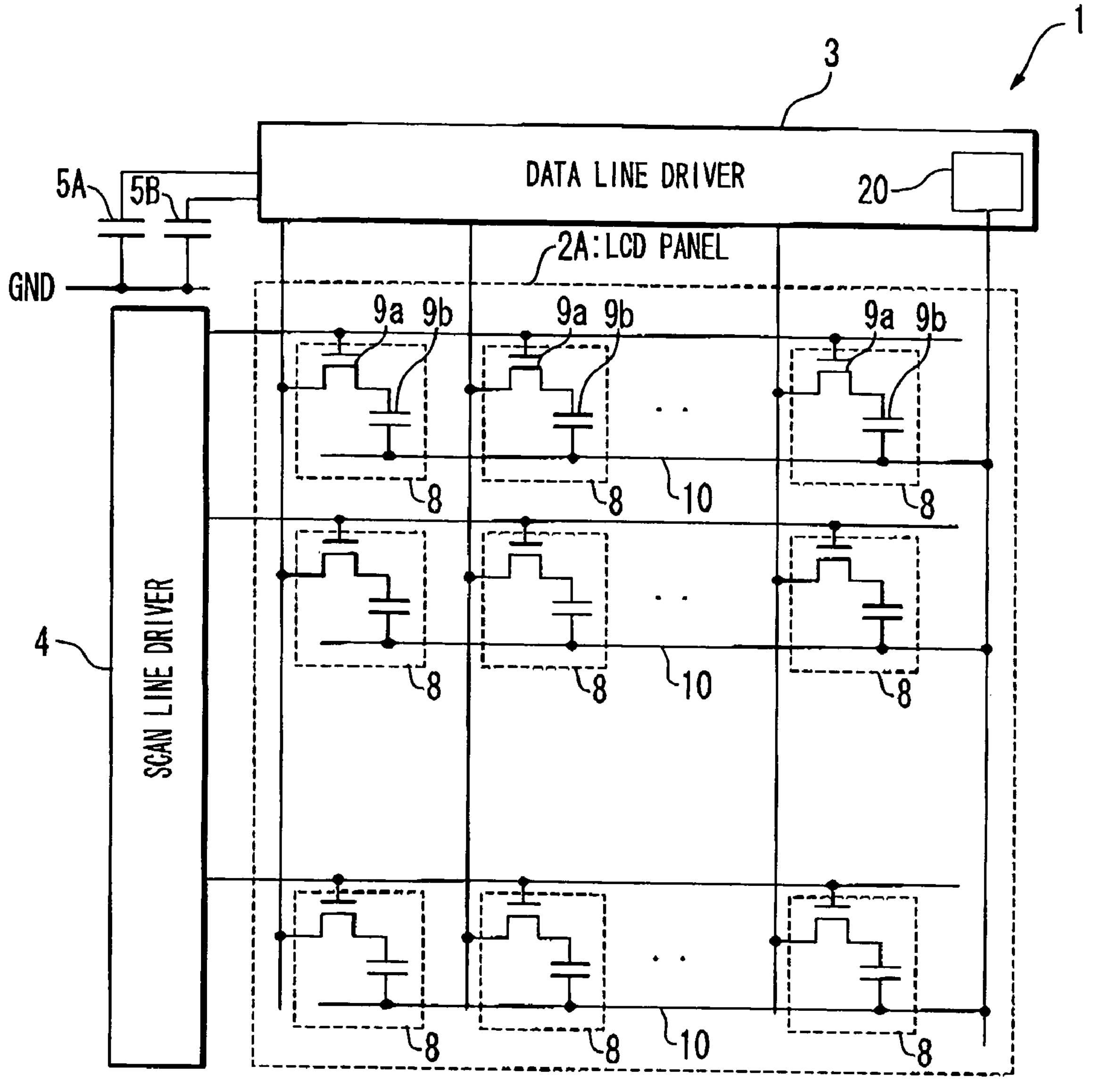
FIG. 3 is a block diagram showing a configuration of a display apparatus according to an embodiment of the present invention.

FIG. 3 is a block diagram showing a configuration of the display apparatus 1 according to an embodiment of the present invention. The display apparatus 1 according to the present embodiment is a liquid crystal display, and is provided with an LCD panel 2A, a data line driver 3, a scan line driver 4, and a pair of a positive polarity charge collecting capacitor 5A and a negative polarity charge collecting capacitor 5B.

The LCD panel 2 includes scan lines 6 extending in a row direction, data lines 7 extending in a column direction, and pixels 8 arranged at positions at which the scan lines 6 intersect the data lines 7, respectively. Each pixel 8 is composed of a thin film transistor (TFT) 9*a* and a pixel electrode 9*b*. A liquid crystal fills a space between the pixel electrode 9*b* and a common electrode 10 opposing to the pixel electrode 9*b*.

The data line driver 3 generates a data signal and drives each data line 7. Specifically, the data line driver 3 receives a pixel data corresponding to each data line 7, and generates the data signal in response to the received pixel data. The data signal has a signal level (a voltage level or a current level) corresponding to the pixel data. In the present embodiment, the pixel data is a digital data of k bits. The data line driver 3 also functions to collect charges accumulated on the data lines 7, move the charges to the charge collecting capacitors 5A and 5B, and to re-use the charges accumulated in the charge collecting capacitors 5A and 5B and to move the charges to the data lines 7. The LCD panel 2 includes a circuit 20 for biasing the common electrodes 10 to a predetermined voltage.

In the present embodiment, the data line driver 3 is configured to perform dot inversion driving. Namely, the data line driver 3 fixes a voltage of the common electrode 10, supplies the data signals having different polarities to adjacent data lines 7, respectively, and inverts the polarities of the data signals for the adjacent scan lines. In addition, the data line driver 3 drives the data lines such that a polarity of a "pixel voltage" supplied to the pixel electrode 9*b* is inverted for every frame. In the present embodiment, the reference voltage is a system ground voltage GND (hereinafter, "zero (volt)" or "ground voltage"). The polarity of each data signal is defined as a positive or a negative polarity relative to the ground voltage.

The scan line driver 4 sequentially selects the scan lines 6 one by one, and activates the selected scan line 6.

The charge collecting capacitor 5A is used to collect the charges from the data lines 7 driven to the positive polarity voltage relative to the ground voltage. The charge collecting capacitor 5B is used to collect the charges from the data line 7 driven to the negative polarity voltage relative to the ground voltage. The data line driver 3 is configured to be able to collect charges into the charge collecting capacitors 5A and 5B and to re-use the charges accumulated on the charge collecting capacitors 5A and 5B.

Figure 4:
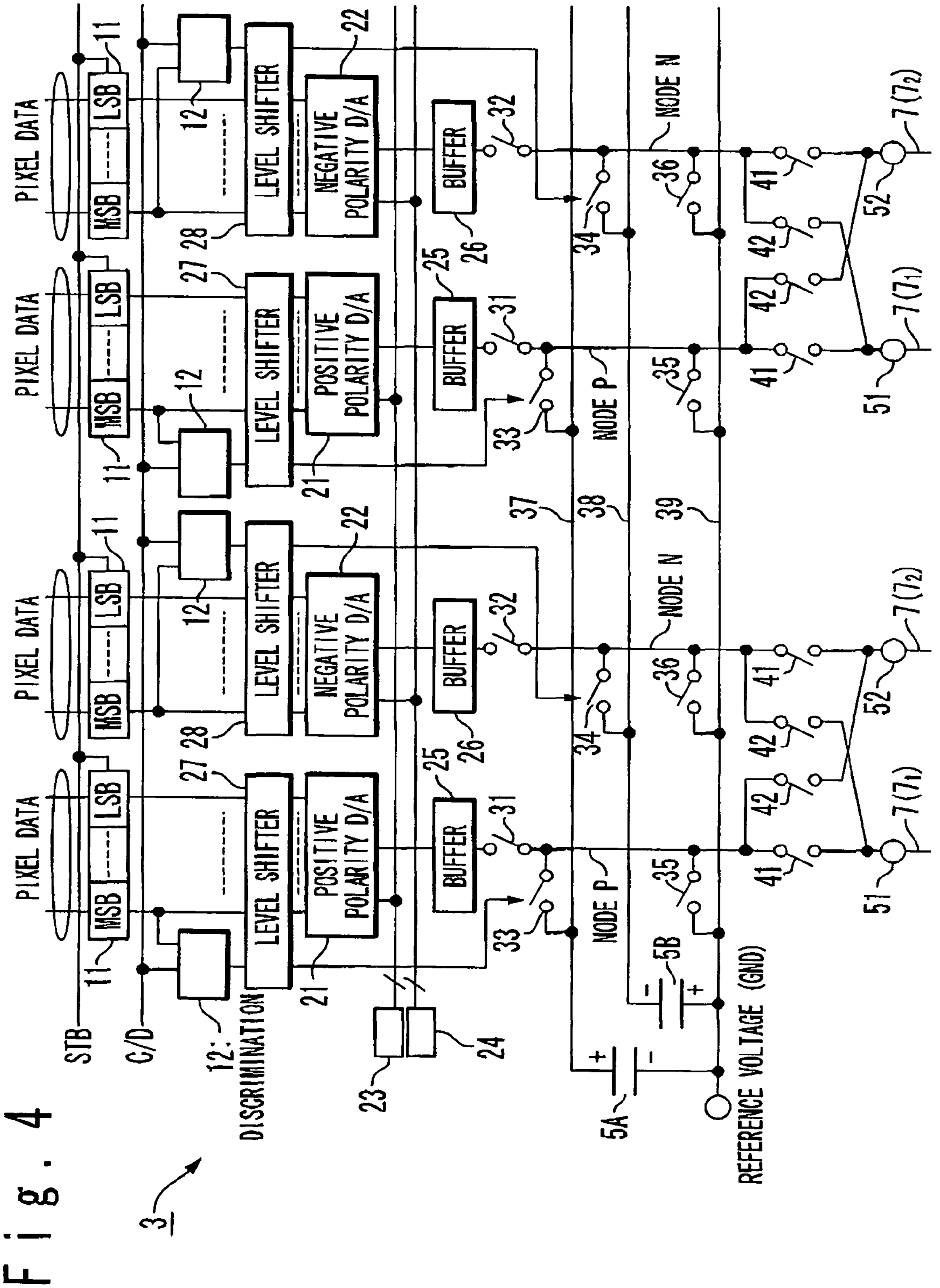
FIG. 4 is a block diagram showing a configuration of a data line driver in the display apparatus according to the present embodiment.
Figures 5A, 5B, 5C, 5D, 5E, 5F, 5G, 5H, 5I, 5J, 5K:
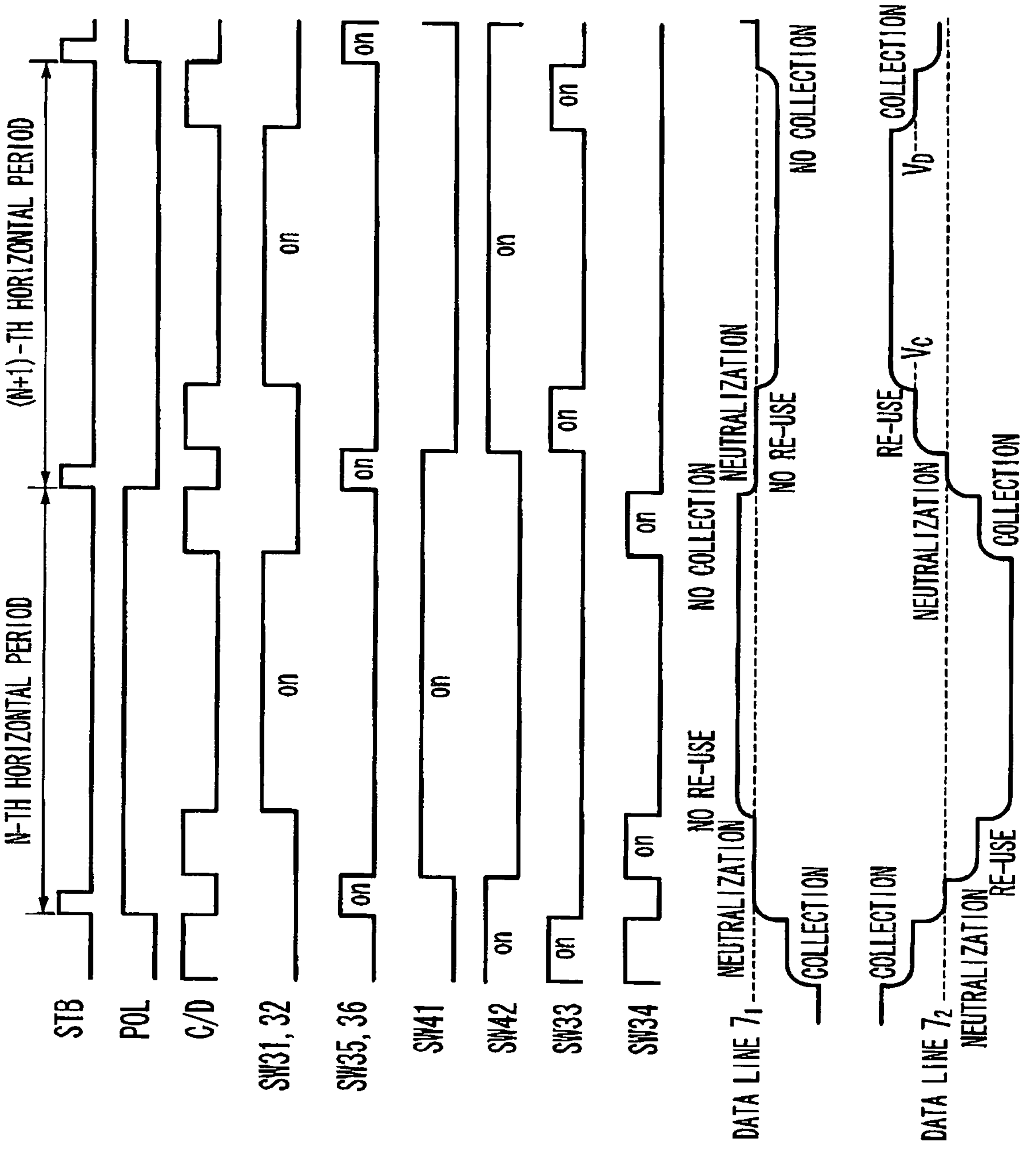
FIGS. 5A to 5K are timing charts showing an operation of a data line driver according to the present embodiment.

FIG. 4 is a block diagram showing a configuration of the data line driver 3. The data line driver 3 includes data latch circuits 11, discriminating circuits 12, positive polarity D/A converter circuits 21, negative polarity D/A converter circuits 22, a positive polarity gradation voltage generating circuit 23, a negative polarity gradation voltage generating circuit 24, positive polarity buffer circuits 25, negative polarity buffer circuits 26, positive polarity level shifters 27, negative polarity level shifters 28, positive polarity output switches 31, and negative polarity output switches 32, positive polarity collection switches 33, negative polarity collection switches 34, positive polarity precharge switches 35, negative polarity precharge switches 36, a positive polarity charge collection line 37, and a negative polarity charge collection line 38, a reference voltage line 39, polarity changeover switches 41 and 42, odd-number output terminals 51 and even-number output terminals 52 connected to the data lines 7, respectively, positive polarity nodes P, and negative polarity nodes N. The data line driver 3 includes a power supply circuit that supplies a voltage necessary to drive the data lines and the liquid crystal common electrodes, a control circuit that controls respective circuits (which are not shown). In the following description, the words "positive polarity" and "negative polarity" are sometimes omitted. For instance, an expression "the positive polarity buffer circuit 25 is connected to an output of the positive polarity D/A converter circuit 21, and the negative polarity buffer circuit 26 is connected to an output of the negative polarity D/A converter circuit 22" is often described as "the buffer circuits 25 and 26 are connected to outputs of the D/A converter circuits 21 and 22, respectively" while omitting the terms "positive polarity" and "negative polarity".

The data latch circuit 11 latches pixel data indicating a gradation of each pixel 8, i.e., a voltage level to which the pixel 8 is to be driven. The data latch circuit 11 is provided for each data line 7, and latches the pixel data for the data line 7. The data latch circuit 11 operates in response to a latch signal STB, to latch the pixel data in response to activation of the latch signal STB.

The discriminating circuit 12 controls the collection switches 33 and 34 in response to higher m bits of the pixel data and to a charge/discharge (C/D) signal. In addition, the discriminating circuit 12 either electrically connects or electrically disconnects a desired data line 7 to or from the charge collecting capacitor 5A or 5B. FIG. 4 shows a configuration for an instance in which m is 1, that is, a configuration in which the discriminating circuit 12 electrically connects the data line 7 to the charge collecting capacitors 5A or 5B in response to the highest bit of the pixel data. The C/D signal is a signal for permitting collection of charges on the data line 7 and re-using of the collected charges. The collection of charges on the data line 7 and the re-using of the collected charges are performed only when the C/D signal is activated. More specifically, if the C/D signal is inactive, the discriminating circuit 12 turns off the corresponding collection switches 33 and 34 irrespective of the pixel data. If the C/D signal is active, the discriminating circuit 12 determines whether the corresponding data line 7 is electrically connected to the charge collecting capacitor 5A or 5B, that is, whether the switch 33 or 34 is turned on in response to the higher m bits of the corresponding pixel data. The discriminating circuit 12 determines the collection switches 33 and 34 to be turned on or off for the following two instances. A first instance is that the charges are collected from one of the data lines 7 after the data lines 7 are driven. After the data lines 7 are driven, one of the data lines 7 having a high driving voltage is selected based on the corresponding pixel data. The collection switches 33 or 34 connected to the selected data line 7 is turned on, and the charges of the selected data line 7 are collected into the charge collecting capacitors 5A or 5B. A second instance is that the charges accumulated in the charge collecting capacitor 5A or 5B are re-used to drive the data line 7. Before driving the data line 7, one of the data lines 7 having a driving voltage is selected based on the value of the corresponding pixel data. The collection switch 33 or 34 connected to the selected data line 7 is turned on, and the charges accumulated in the charge collecting capacitor 5A or 5B are refused to drive the selected data line 7.

Each of the level shifters 27 and 28 converts levels of output signals outputted from the data latch circuit 11 and the discriminating circuit 12. The level shifters 27 and 28 match signal levels of output signals from the data latch circuit 11 and the discriminating circuit 12 to those of input signals to the D/A converter circuits 21 and 22 and the collection switches 33 and 34. The positive polarity level shifter 27 converts a voltage level of zero to 2.8V into a voltage level of zero to 5V. The negative polarity level shifter 28 converts a voltage level of zero to 2.8V into a voltage level of −5 to 0V. The precharge switches 35 and 36, and the polarity changeover switches 41 and 42 are controlled in response to control signals from the control circuit (not shown) through the level shifters.

The gradation voltage generating circuits 23 and 24 generate $2^k$ gradation voltages different in voltage level and supply the generated gradation voltages to the D/A converter 21 and 22, respectively. The D/A converter circuits 21 and 22 select the gradation voltages corresponding to the pixel data from among the $2^k$ gradation voltages received from the gradation voltage generating circuits 23 and 24, and output the selected gradation voltages, respectively.

The buffer circuits 25 and 26 perform impedance matching between outputs from the D/A converter circuits 21 and 22 and those of the data lines 7, respectively. Each of the buffer circuits 25 and 26 is composed of a voltage follower, generates a data signal equal in voltage level to the gradation voltage supplied from the D/A converter circuit 21 or 22, and supplies the generated data signal to the data line 7. If the number of pixels of the LCD panel 2 is small, the D/A converter circuits 21 and 22 may be configured to directly drive the data line without providing the buffer circuits. The output switches 31 and 32 are provided between the buffer circuits 25 and 26 and the nodes P and N, respectively. In a driving preparation period (ground precharge period), a collection period, and a re-use period, the output switches 31 and 32 are turned off to shut off outputs from the buffer circuits 25 and 26, respectively.

The positive polarity D/A converter circuit 21, the positive polarity gradation voltage generating circuit 23, the positive polarity buffer circuit 25, and the positive polarity output switch 31 in a positive polarity driving circuit generate a positive polarity data signal. The positive polarity driving circuits operate in a voltage range from 0V to VPH. The voltage VPH is, for example, 5 [V]. The positive polarity gradation voltage generating circuit 23 generates $2^k$ positive polarity gradation voltages different in voltage level, and supplies the generated gradation voltages to the positive polarity D/A converter circuit 21. The gradation voltages generated by the positive polarity gradation voltage generating circuit 23 are equal to or higher than 0V and equal to or lower than VPH. The positive polarity D/A converter circuit 21 selects the gradation voltage corresponding to the pixel data received from the data latch circuit 11 through the positive polarity level shifter 27 from among the $2^k$ gradation voltages received from the positive polarity gradation voltage generating circuit 23. In addition, the positive polarity D/A converter circuit 21 supplies the selected gradation voltage to the positive polarity buffer circuit 25. The positive polarity buffer circuit 25 performs the impedance matching between the positive polarity D/A converter circuit 21 and the data line 7. The positive polarity buffer circuit 25 is composed of a voltage follower. The positive polarity buffer circuit 25 outputs the data signal equal in voltage level to the gradation voltage supplied from the positive polarity D/A converter circuit 21 to the positive polarity node P. The positive polarity switch 31 is provided between the output of the positive polarity buffer circuit 25 and the positive polarity node P. The positive polarity switch 31 electrically connects or disconnects the output of the positive polarity buffer circuit 25 to or from the positive polarity node P.

The negative polarity D/A converter circuit 22, the negative polarity gradation voltage generating circuit 24, the negative polarity buffer circuit 26, and the negative polarity output switch 32 in a negative polarity driving circuit generate a negative polarity data signal. These negative polarity driving circuits operate in a voltage range from VNL to 0V. The voltage VNL is, for example, −5V. The negative polarity gradation voltage generating circuit 24 generates $2^k$ negative polarity gradation voltages different in voltage level, and supplies the generated gradation voltages to the negative polarity D/A converter circuit 22. The gradation voltages generated by the negative polarity gradation voltage generating circuit 24 are equal to or higher than the VNL and equal to or lower than 0V. The negative polarity D/A converter circuit 22 selects the gradation voltage corresponding to the pixel data received from the data latch circuit 11 through the negative polarity level shifter 27 from among the $2^k$ gradation voltages received from the negative polarity gradation voltage generating circuit 24. In addition, the negative polarity D/A converter circuit 22 supplies the selected gradation voltage to the negative polarity buffer circuit 26. Similarly to the positive polarity buffer circuit 25, the negative polarity buffer circuit 26 performs the impedance matching. The negative polarity buffer circuit 26 outputs the data signal equal in voltage level to the gradation voltage supplied from the negative polarity D/A converter circuit 22 to the negative polarity node N. The negative polarity switch 32 is provided between the output of the negative polarity buffer circuit 26 and the negative polarity node N. The negative polarity switch 32 electrically connects or disconnects the output of the negative polarity buffer circuit 26 to or from the negative polarity node N.

The polarity changeover switches 41 and 42 function to connect one of the nodes P and N to the odd-number output terminal 51 and the other node to the even-number output terminal 52 in response to a signal delayed by several clock cycles from the polarity signal POL. If the positive polarity data signal and the negative polarity data signal are outputted from the odd-number output terminal 51 and the even-number output terminal 52, respectively, the polarity changeover switch 41 connects the odd-number output terminal 51 to the positive polarity node P and the even-number output terminal 52 to the negative polarity node N. If the negative polarity data signal and the positive polarity data signal are outputted from the odd-number output terminal 51 and the even-number output terminal 52, respectively, the polarity changeover switch 42 connects the odd-number output terminal 51 to the negative polarity node N and the even-number output terminal 52 to the positive polarity node P. An operation voltage range of the polarity changeover switches 41 and 42 may be from VNL to VPH, e.g., from the VNL of −5V to the VPH of 5V, or may be in a range from VGOFF to VGON, e.g., from the VGOFF of −10V to the VGON of 10V. The VGON is an activation voltage for the scan line 6 and the VGOFF is a deactivation voltage therefor.

The collection switches 33 and 34, the precharge switches 35 and 36, the charge collection lines 37 and 38, and the reference voltage line 39 are used to collect and re-use the charges by using the charge collecting capacitors 5A and 5B. The positive polarity collection switch 33 is provided between the positive polarity charge collection line 37 and the positive polarity node P. The negative polarity collection switch 34 is provided between the negative polarity charge collection line 38 and the negative polarity node N. The positive polarity charge collection line 37 is connected to one end of the positive polarity charge collecting capacitor 5A, and the negative polarity charge collection line 38 is connected to one end of the negative polarity charge collecting capacitor 5B. The reference voltage line 39 has a voltage of 0V (a ground voltage), and is connected to the other ends of the charge collecting capacitors 5A and 5B. The positive polarity precharge switch 35 is provided between the reference voltage line 39 and the positive polarity node P, and the negative polarity precharge switch 36 is provided between the reference voltage line 39 and the negative polarity node N. The precharge switches 35 and 36 control precharge of the nodes P and N with the ground voltage, respectively. The positive polarity collection switch 33 and the positive polarity precharge switch 35 operate in a voltage range from zero to VPH. The negative polarity collection switch 34 and the negative polarity precharge switch 36 operate in a voltage range from VNL to 0V. As will be described later, the positive polarity precharge switch 35 prevents a voltage lower than 0V from being applied to the positive polarity node P. In addition, the negative polarity precharge switch 36 prevents a voltage higher than 0V from being applied to the negative polarity node N. Each of the positive polarity precharge switch 35 and the negative polarity precharge switch 36 may be an analog switch of a MOS transistor and furthermore may be a diode element.

The data latch circuits 11 and the discriminating circuits 12 are formed from low voltage elements, the polarity changeover switches 41 and 42 are formed from high voltage elements, and the remaining circuits are formed from intermediate voltage elements. Breakdown voltages of the elements are such that (low voltage element)<(intermediate voltage element)<(high voltage element). For instance, the breakdown voltage of the low voltage element is 3V, that of the intermediate voltage element is 6V, and that of the high voltage element is 12V. If the elements are MOS transistors, thicknesses of gate oxide films Tox of the MOS transistors are such that Tox (low voltage)<Tox (intermediate voltage)<Tox (high voltage). Further, the smallest gate lengths L of the MOS transistors are such that L (low voltage)<L (intermediate voltage)<L (high voltage). Due to this, the high voltage element is larger in circuit area than the low voltage element and the intermediate voltage element. It is, therefore, preferable to provide the data line driver 3 with a circuit configuration in which the high voltage elements are used as little as possible. In the circuit configuration according to the present embodiment, the data line driver 3 can be made small in size by reducing circuit areas of the D/A converter circuits and the buffer circuits that account for a large percentage of the circuit area.

The data line driving circuit 3 also includes a common power supply circuit 20. The voltage applied to each pixel 8 turns into an offset voltage by feed-through of the TFT when the TFT is turned off. Due to this, a voltage fixed to about −2V to 0.1V for the nTFT and about 0.1V to 2V for the PTFT is supplied to the common electrode 10 from the common power supply circuit 20. Since a voltage $V_{COM}$ of the common electrode 10 is adjusted for every LCD panel, convenience during adjustment is improved by including the common power supply circuit 20 in the data line driver 3 that includes the gradation voltage generating circuits 23 and 24.

By setting the reference voltage to the ground voltage, it is possible to decrease the number of times of boosting a charge pumping DC-DC converter of a plurality of switches and capacitors for generating the VPH voltage and the VNL voltage. It is assumed that a VDC voltage (2.8V) is supplied to the data line driver 3, the VPH voltage is 5V, the VNL voltage is −5V, and the common voltage is −1V. To generate the VPH voltage, the DC-DC converter of the power supply circuit 20 of the data line driver 3 boosts the VDC voltage (2.8V) twofold to the VDC voltage (5.6V), and the VPH voltage (5V) is generated from this twofold VDC voltage (5.6V) Likewise, the VNL voltage (−5V) is generated from the VDC voltage (−5.6V) which is −2 times as high as 2.8V. However, if the common voltage is set to 0V, then the VPH voltage is shifted to 6V and the VNL voltage is shifted to −4V. Due to this, it is necessary to boost the VDC voltage (2.8V) three-folds to VDC voltage (8.4V) and to generate a voltage of 6V so as to generate the VPH voltage (6V). As a result, the number of times of boosting increases to two. Efficiency for boosting the charge-pumping DC-DC converter once is about 80 percent. The efficiency is deteriorated down to about 64 percent if the charge-pumping DC-DC converter is boosted twice. Considering these, the reference voltage is set to the system ground voltage, whereby the efficiency for boosting the DC-DC converter can be improved. Further, since each of the D/A converter circuits 21 and the buffers 25 serving as the positive polarity circuits cannot be formed out of the intermediate voltage element (having the breakdown voltage of 6V), the circuit area of each of these positive polarity circuits is large.

2. Operation of Data Line Driver

The data line driver 3 according to the present embodiment is configured so that each discriminating circuit 12 electrically connects or disconnects the corresponding data line 7 to the charge collecting capacitors 5A and 5B in response to higher m bits (where m<k) of the pixel data and a C/D signal. Specifically, during collection of charges, only the data lines 7 having large relative voltage differences to the ground voltage are selectively connected to the charge collecting capacitors 5A and 5B.

This operation has mainly three advantages. A first advantage is as follows. During collection of charges, only the data lines 7 selected according to the pixel data are connected to the charge collecting capacitors 5A and 5B, whereby the collection of charges into the charge collecting capacitors 5A and 5B can be efficiently performed. If the data lines 7 at relatively lower voltage levels than the voltages of the charge collecting capacitors 5A and 5B to the ground voltage are connected to the charge collecting capacitors 5A and 5B, the charges are conversely emitted from the charge collecting capacitors 5A and 5B. As a result, the charge collection efficiency is deteriorated. In the display apparatus 1 according to the present embodiment, the data lines 7 driven to relatively low voltage levels can be excluded the data lines 7 from charge collection target. This makes it possible to efficiently collect charges into the charge collecting capacitors 5A and 5B.

A second advantage is as follows. During re-using of charges, only the data lines 7 selected according to the pixel data are connected to the charge collecting capacitors 5A and 5B, whereby the charges accumulated in the charge collecting capacitors 5A and 5B can be efficiently re-used. The charges moved to the data lines 7 to be driven to relatively lower voltage levels than the voltages of the charge collecting capacitors 5A and 5B to the ground voltage are eventually discarded at the time of driving the data lines 7 without being effectively used. In the display apparatus 1 according to the present embodiment, only the data lines 7 selected according to the pixel data are connected to the charge collecting capacitors 5A and 5B. It is thereby possible to exclude the data lines 7 driven to relatively low voltage levels from the charge re-using target. This makes it possible to effectively re-use the charges accumulated in the charge collecting capacitors 5A and 5B.

A third advantage is as follows. Each discriminating circuit 12 operates in response to not all bits of the pixel data but higher m bits (m<k) of the pixel data (with no regard to lower (k-m) bits), thereby making it possible to simplify a circuit configuration of the discriminating circuit 12. The lower bits of the pixel data have a smaller influence on the signal level of the data signal and ineffective for selection of appropriate data lines 7 in the charge collection and charge re-using operations. To disregards the lower (k-m) bits of the pixel data is effective to simplify the circuit configuration of the discriminating circuit 12. To simplify the circuit configuration of the discriminating circuit 12, it is preferable that m is equal to or smaller than k/2. For instance, if the number of bits of the pixel data is 6, it is preferable to select the charge collection and charge re-using target data lines 7 in response to a highest bit, higher 2 bits or higher 3 bits of the pixel data.

From viewpoints of simplification of the circuit configuration of the discriminating circuit 12, it is most preferable that m is equal to 1, that is, the discriminating circuit 12 operates in response only to the highest bit of the pixel data. If m is equal to 1, the discriminating circuit 12 can be constituted, in a simplest configuration, by a logic gate such as a two-input AND gate or a NAND gate to which the highest bit of the pixel data and the C/D signal are input. In this case, an output signal outputted from the two-input logic gate is used as a control signal to turn on or off the collection switches 33 and 34 through the level shifters 27 and 28.

According to the present embodiment, the charge collecting capacitors 5A and 5B are separately used to measure the dot inversion driving. More specifically, if the collection of charges is performed, the data line 7 to be connected to the positive polarity charge collecting capacitor 5A is selected from among the data lines 7 driven by the positive polarity data signal just before the charge collection. In addition, the data line 7 to be connected to the negative polarity charge collecting capacitor 5B is selected from among the data lines 7 driven by the negative polarity data signal. Likewise, if the re-use of charges is performed, the data line 7 to be connected to the positive polarity charge collecting capacitor 5A is selected from among the data lines 7 driven by the positive polarity data signal. In addition, the data line 7 to be connected to the negative polarity charge collecting capacitor 5B is selected from among the data lines 7 driven by the negative polarity data signal.

Furthermore, before the polarity of the data line 7 is changed over, then the precharge switches 35 and 36 are turned on to precharge the data lines 7. Precharging of the data lines 7 effectively prevents a voltage lower than 0V from being applied to the positive polarity node P, and a voltage higher than 0V from being applied to the negative polarity node N. This is preferable since this makes it possible to reduce breakdown voltages required for the transistors that constitute the output switches 31 and 32, the collection switches 33 and 34, the precharge switches 35 and 36, the buffer circuits 25 and 26, and the D/A converter circuits 21 and 22 connected to the nodes P and N.

An example of the operation of the data line driver 3 during an nth horizontal period and an (n+1)-th horizontal period will be specifically described. It is assumed herein that the data line 7 (hereinafter, "data line $7_1$") connected to the odd-number output terminal 51 in the (n+1)-th horizontal period is driven to a negative polarity voltage. In addition, the data line 7 (hereinafter, "data line $7_2$") connected to the even-number output terminal 52 in the (n+1)-th horizontal period is driven to a positive polarity voltage.

It is also assumed herein that the number of bits of the pixel data is 6 and that m is equal to 1. In addition, the LCD panel 2 is a normally white LCD panel that displays a white image when no voltage is applied to each pixel 8. It is defined that if the highest bit of the pixel data is "0", the pixel 8 displays a black image in black, and that if the highest bit is "1", the pixel 8 displays a white image. If the pixel data is "000000", the relative voltage of the data signal supplied to the pixel 8 to the ground voltage is the highest. If the pixel data is "11111", the relative voltage of the data signal supplied to the pixel 8 to the ground voltage is the lowest.

It is noted in the present embodiment that the charges are collected from the corresponding data line 7 if the pixel 8 displays a black image, and that no charges are collected from the corresponding data line 7 if the pixel 8 displays a white image. In other words, if the highest bit of the pixel data is "0", the charges are collected from the corresponding data line 7. If the highest bit is "1", no charges are collected from the data line 7.

FIGS. 5A to 5K are timing charts showing an example of waveforms of the latch signal STB, the C/D signal, and the voltage of the data line 7 in the n-th horizontal period and the (n+1)-th horizontal period. The nth horizontal period means a horizontal period (or scan period) in which the pixels 8 on the nth scan line are driven.

Each horizontal period includes a driving preparation period as an initial period, and a re-use period, a drive period, and a collection period subsequent to the driving preparation period. A period during which the scan line 6 is activated is a period excluding the collection period at least in each horizontal period. In this period, before the C/D signal is activated to perform the charge collection operation, the scan line 6 is deactivated and the TFT of each pixel 8 is turned off. Therefore, the collection operation does not influence an image quality.

As shown in FIGS. 5A to 5K, in the driving preparation period, the latch signal STB is activated first, the polarity signal POL is inverted, and the C/D signal is deactivated. In response to activation of the latch signal STB, the data latch circuit 11 latches the pixel data. In the driving preparation period of the (n+1)-th horizontal period shown in FIGS. 5A to 5K, similarly to the re-use period, the drive period, and the collection period of the n-th horizontal period, the polarity changeover switch 41 is turned on and the polarity changeover switch 42 is turned off.

Figure 6A:
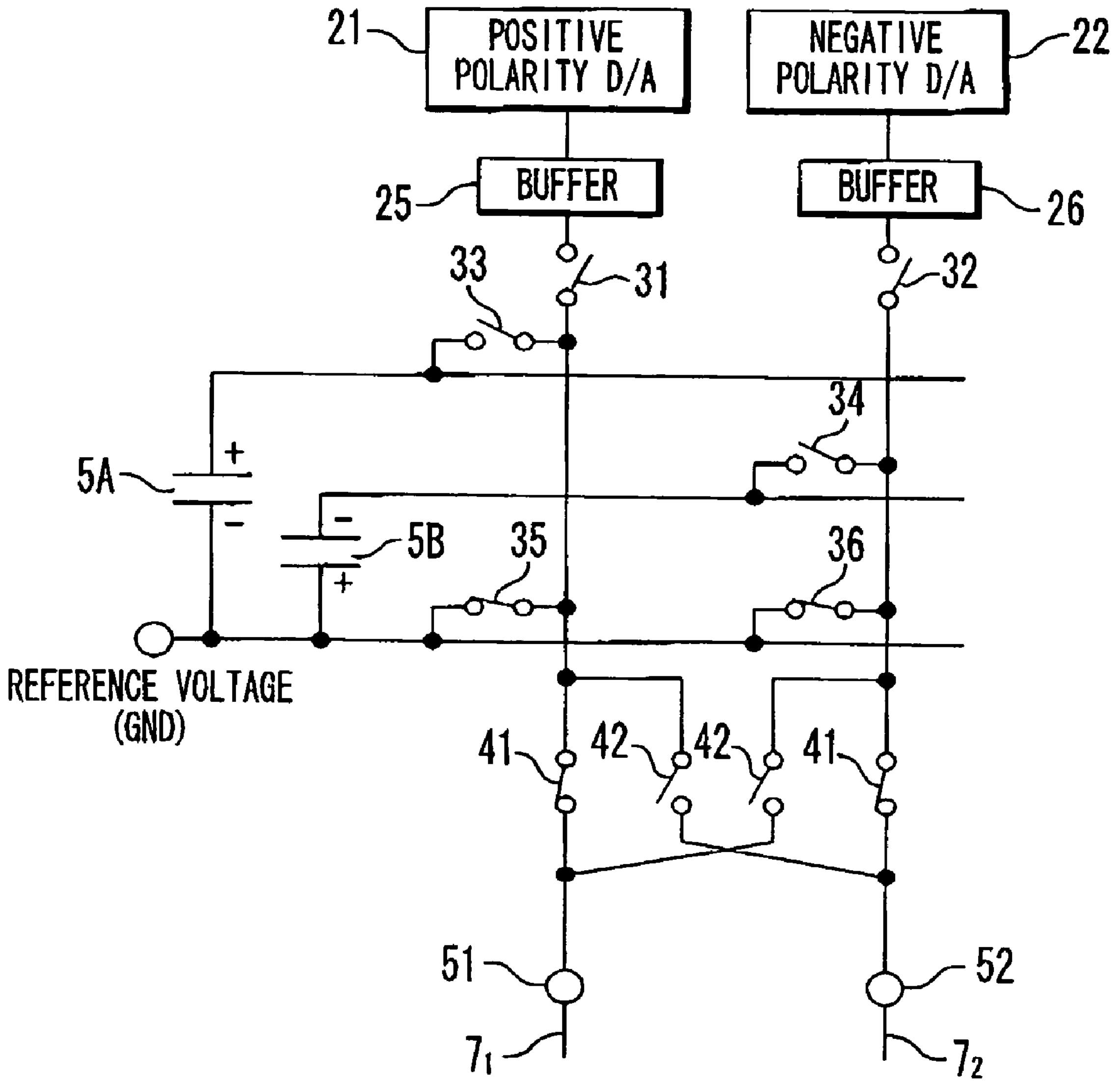
FIG. 6A is a circuit diagram showing a precharging operation of the data line driver according to the present embodiment.

As shown in FIG. 6A, while the output switches 31 and 32 are turned off, the precharge switches 35 and 36 are turned on. Each data line 7 is thereby precharged with the ground voltage. In the present embodiment, the polarity of the data signal is changed over several clock cycles after the polarity signal POL is inverted. This can prevent the voltage lower than 0V from being applied to the node P, and the voltage higher than 0V from being applied to the node N. It is thereby possible to form the output switches 31 and 32, the collection switches 33 and 34, and the precharge switches 35 and 36 from the same intermediate voltage elements as those forming the buffers 25 and 26.

Figure 6B:
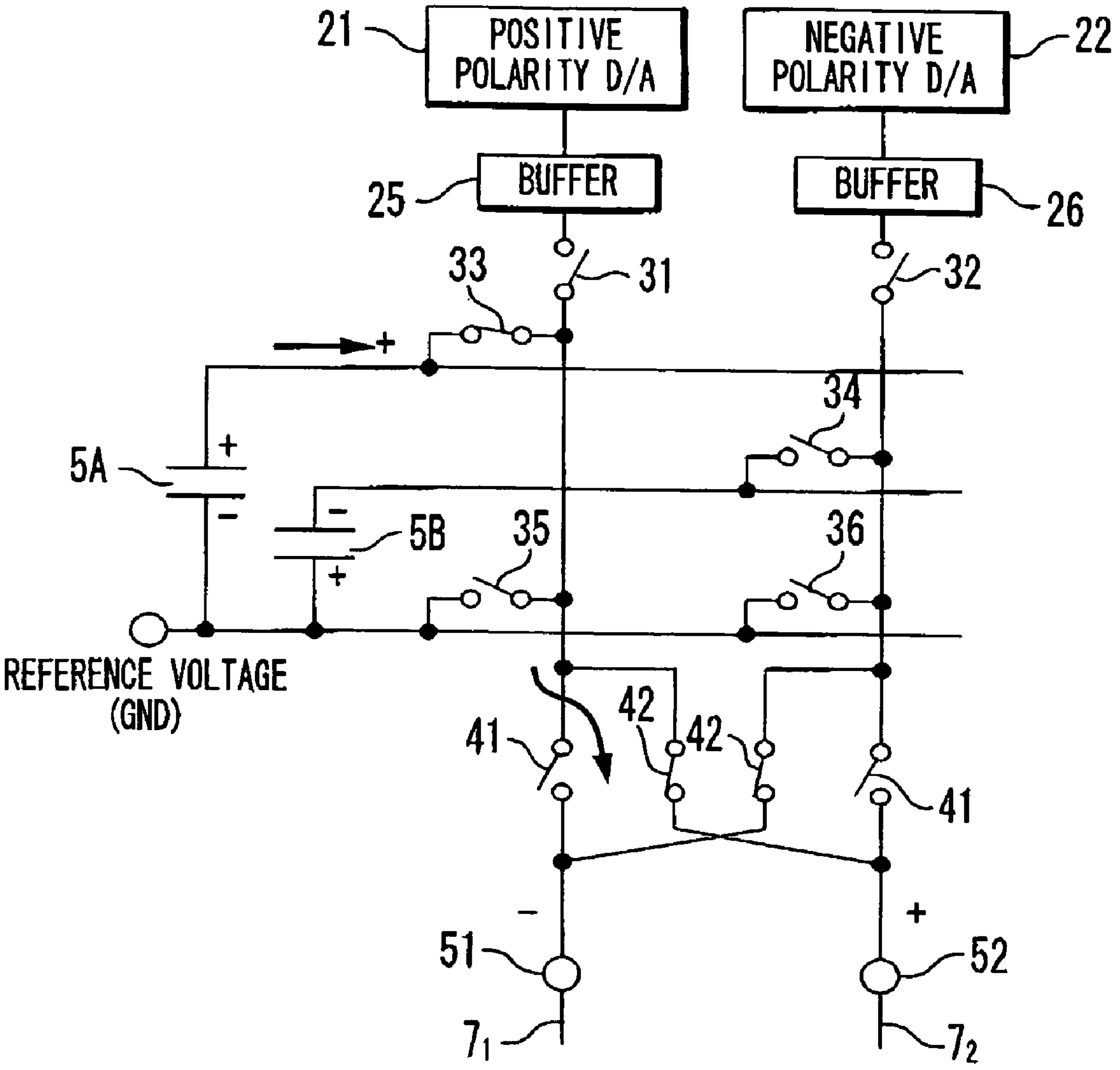
FIG. 6B is a circuit diagram showing a charge re-using operation of the data line driver according to the present embodiment.

Referring back to FIGS. 5A to 5K, in the re-use period subsequent to the driving preparation period, the polarity changeover switches 41 and 42 are changed over after several clock cycles from the inversion of the polarity signal POL. In addition, the C/D signal is activated, and the charges accumulated in the charge collecting capacitors 5A and 5B are re-used for driving the data lines 7. As already described, the data lines 7 to which the charges are moved from the respective charge collecting capacitors 5A and 5B are selected in response to higher m bits (the highest bit in the present embodiment) of the pixel data, and the charges are moved only to the selected data lines 7. FIGS. 5A to 5K shows voltage levels of the data lines $7_1$ and $7_2$ if the re-use of charges is not performed for the data line $7_1$ and performed for the data line $7_2$. More specifically, as shown in FIG. 6B, for the data line $7_1$ driven to the negative polarity voltage in the (n+1)-th horizontal period, the highest bit of the pixel data latched by the data latch circuit 11 is "1". Accordingly, the corresponding collection switch 34 is not turned on, and no charges are moved from the charge collecting capacitor 5B to the data line $7_1$. Conversely, for the data line $7_2$ driven to the positive polarity in the (n+1)-th horizontal period, the highest bit of the pixel data latched by the data latch circuit 11 is "0". Accordingly, the corresponding positive polarity collection switch 33 is turned on, and the data line $7_2$ is connected to the positive polarity charge collecting capacitor 5A through the polarity changeover switch 42 and the positive polarity collection switch 33. The charges are thereby moved from the positive polarity charge collecting capacitor 5A to the data line $7_2$.

Figure 6C:
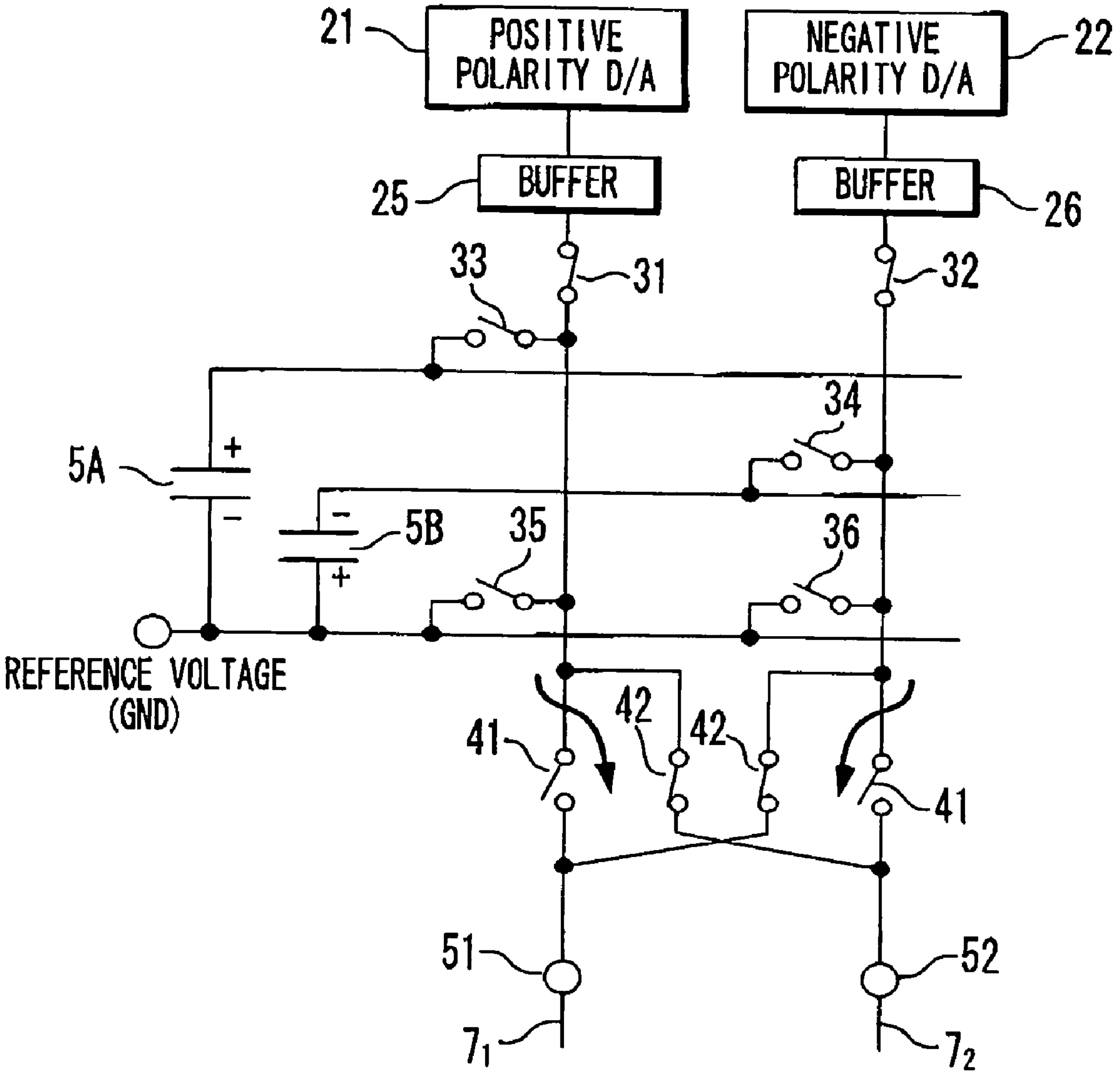
FIG. 6C is a circuit diagram showing a driving operation of the data line driver according to the present embodiment.

In the drive period subsequent to the re-use period, each data line 7 is driven in response to the pixel data latched by the data latch circuit 11 as shown in FIGS. 5A to 5K. Specifically, as shown in FIG. 6C, the collection switches 33 and 34 are turned off in response to deactivation of the C/D signal, and the output switches 31 and 32 are turned on. Since the polarity changeover switch 41 is turned off and the polarity changeover switch 42 is turned on, the positive polarity buffer circuit 25 and the negative polarity buffer circuit 26 are connected to the data lines $7_2$ and $7_1$ to output the positive polarity data signal and the negative polarity data signal, respectively. The data lines $7_1$ and $7_2$ are thereby driven to the negative polarity voltage and the positive polarity voltage, respectively.

Figure 6D:
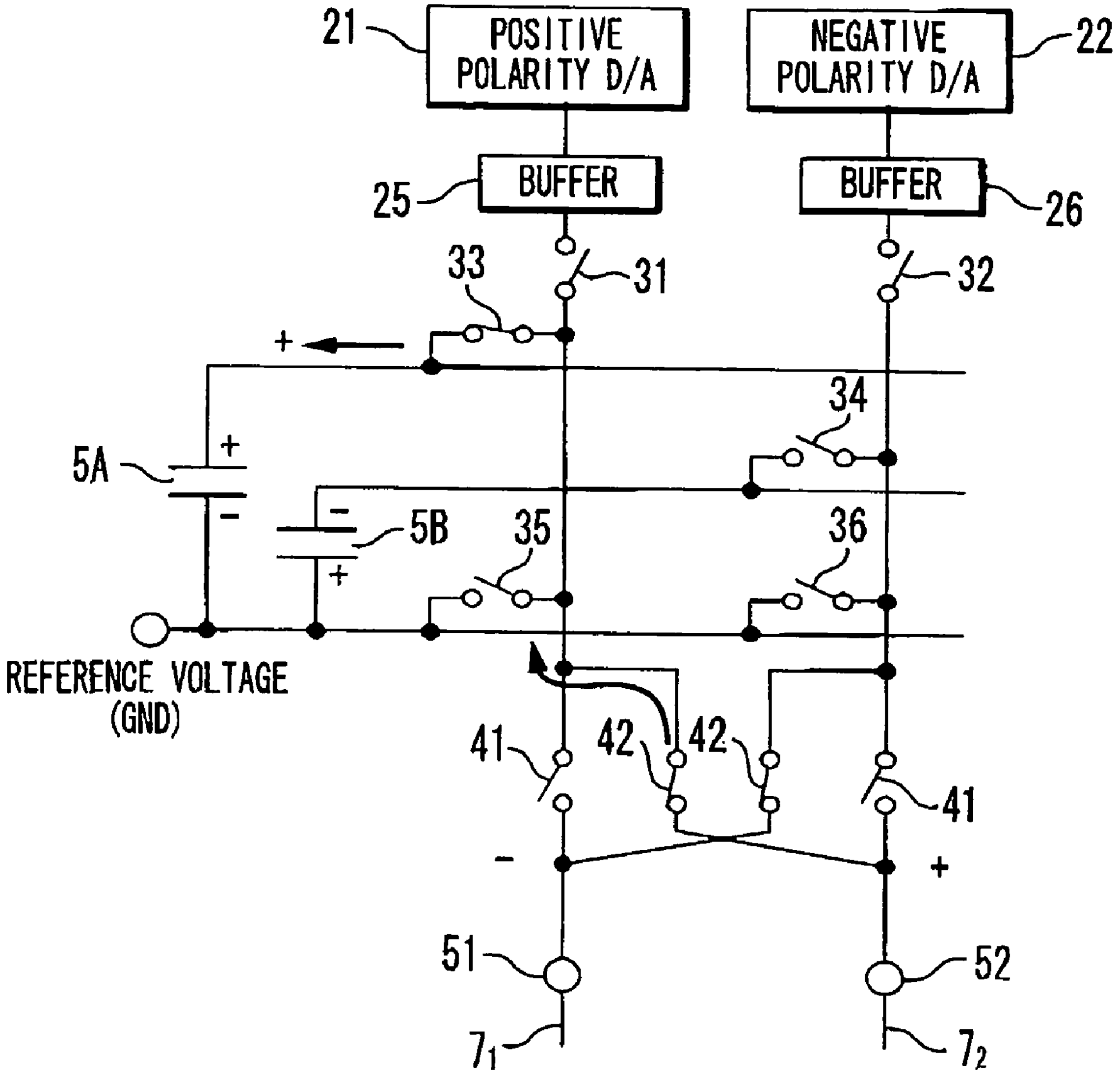
FIG. 6D is a circuit diagram showing a charge collecting operation of the data line driver according to the present embodiment.

Referring back to FIGS. 5A to 5K, in the collection period subsequent to the drive period, the C/D signal is activated and the charges are collected from the data lines 7 into the charge collecting capacitors 5A and 5B. As stated above, the data lines 7 from which the charges are collected are selected in response to the higher m bits (the highest bit in the present embodiment) of the pixel data, and the charges are collected from the selected data lines 7 into the charge collecting capacitors 5A and 5B, respectively. FIGS. 5A to 5K shows voltage level of the data lines $7_1$ and $7_2$ if no charges are collected from the data line $7_1$ but charges are collected from the data line $7_2$. More specifically, as shown in FIG. 6D, for the data line $7_1$ driven to the negative polarity voltage in the (n+1)-th horizontal period, the highest bit of the pixel data latched by the data latch circuit 11 is "1". Accordingly, the corresponding collection switch 34 is not turned on, and no charges are collected into the negative polarity charge collecting capacitor 5B from the data line $7_1$. Conversely, for the data line $7_2$ driven to the positive polarity in the (n+1)-th horizontal period, the highest bit of the pixel data latched by the data latch circuit 11 is "0". Accordingly, the corresponding positive polarity collection switch 33 is turned on, and the data line $7_2$ is connected to the positive polarity charge collecting capacitor 5A through the polarity changeover switch 42 and the positive polarity collection switch 33. The charges are thereby collected into the positive polarity charge collecting capacitor 5A from the data line $7_2$.

In the n-th horizontal period which is the horizontal period prior to the (n+1)-th horizontal period, the data lines $7_1$ and $7_2$ are driven to the positive polarity voltage and the negative polarity voltage, respectively. In the re-use period of the n-th horizontal period, the data line $7_1$ selected according to the highest bit of the pixel data is connected to the positive polarity charge collecting capacitor 5A, and the data line $7_1$ selected according to the highest bit of the pixel data is connected to the negative polarity charge collecting capacitor 5B. The charges are thereby re-used only for the desired data lines $7_1$ and $7_2$. In the collection period of the n-th horizontal period, the data line $7_1$ selected according to the highest bit of the pixel data is connected to the positive polarity charge collecting capacitor 5A, and the data line $7_2$ selected according to the highest bit of the pixel data is connected to the negative polarity charge collecting capacitor 5B. The charges are thereby collected only from the desired data lines $7_1$ and $7_2$.

Figure 8:
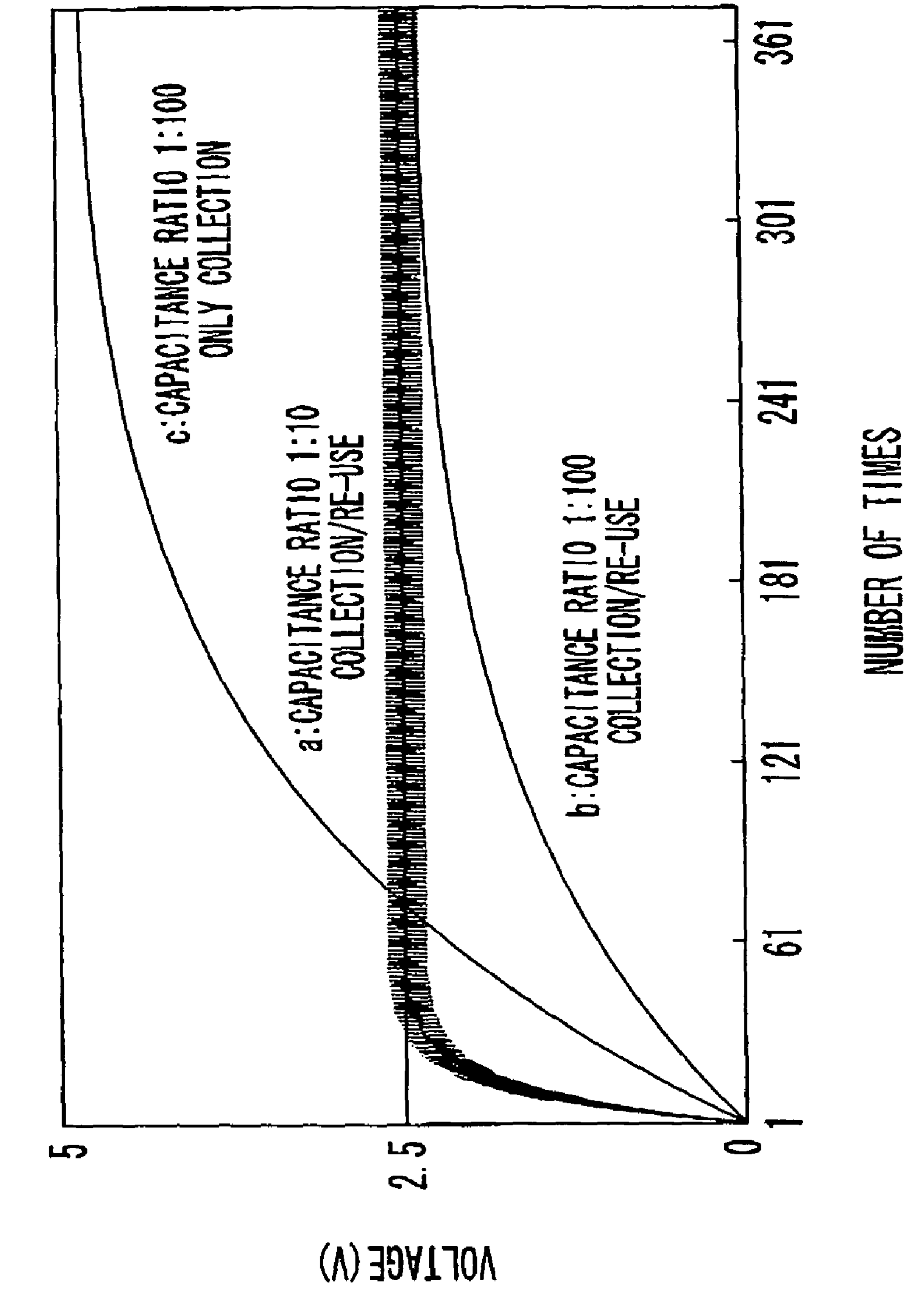
FIG. 8 is a graph showing a change in voltage of a charge collection capacitor if full black display is performed.

FIG. 8 is a graph showing a change in the voltage of the positive polarity charge collecting capacitor 5A if all the pixels 8 display a black image (that is, all pixel data is "000000"). In FIG. 8, the horizontal axis indicates the number of times of the driving operation of the data lines 7. A curve a shows a voltage of the positive polarity charge collecting capacitor 5A if a ratio of a summation value of parasitic capacitances of all the data lines 7 to a capacitance value of the positive polarity charge collecting capacitor 5A is 1:10. A curve b shows the voltage of the positive polarity charge collecting capacitor 5A if the ratio is 1:100. As conspicuously shown in a left end part of the curve b, the voltage of the positive polarity charge collecting capacitor 5A rises according to the collection of the charges and falls according to the re-use of the charges. The reason that the voltage of the positive polarity charge collecting capacitor 5A rises during the collection of charges is that the charges are collected only from the data lines 7 higher in voltage level than the positive polarity charge collecting capacitor 5A. In the conventional display apparatus shown in FIG. 1, the voltage of the positive polarity capacitor 220 often falls during the collection of charges.

As shown in FIG. 8, if the highest voltage level of the positive polarity data signal is Va (>0), the voltage of the positive polarity charge collecting capacitor 5A is about Va/2 in a stationary state. Likewise, if the lowest voltage level of the negative polarity data signal is Vb (<0), the voltage of the negative polarity charge collecting capacitor 5B is about Vb/2 in a stationary state.

Figure 9:
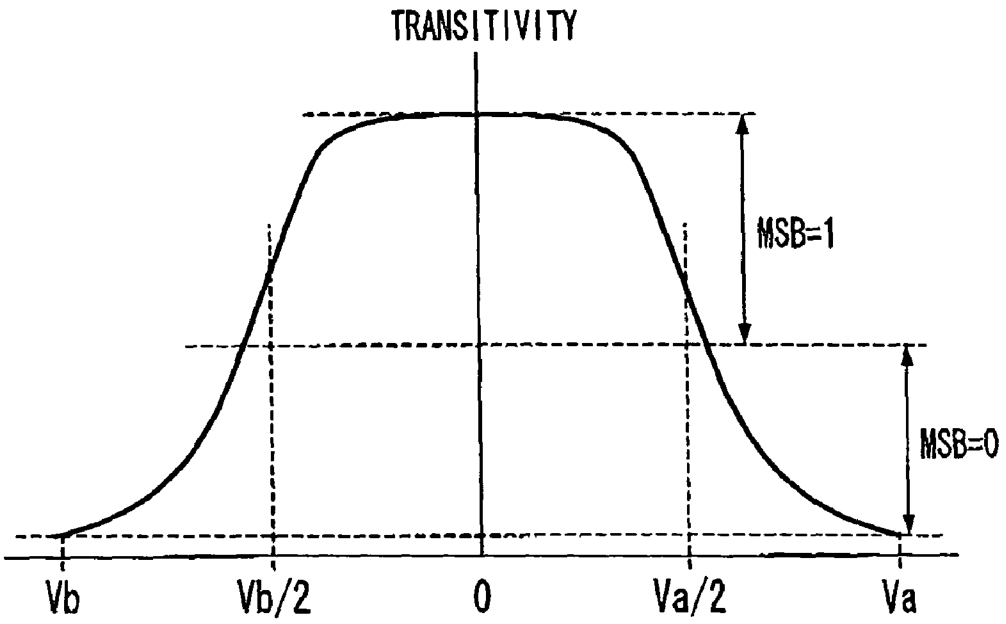
FIG. 9 is a graph showing a relationship between a voltage level of a data line and a highest bit of pixel data.

As can be understood from FIG. 9, the highest bit of the pixel data substantially corresponds to whether or not the voltage level of the data line 7 falls within a range from Vb/2 to Va/2. Accordingly, if the data lines 7 for which the collection and re-using of charge is performed are selected in response to the highest bit of the pixel data, the collection and re-using of charges is performed substantially only for the data line 7 higher in voltage level than the positive polarity charge collecting capacitor 5A and for the data line 7 lower in voltage level than the negative polarity charge collecting capacitor 5B. This means that the use of the highest bit of the pixel data makes it possible to select the data lines 7 suited for the collection and re-use of charges with sufficiently high practical certainty.

In order to further improve the charge collection efficiency, it is preferable to collect charges only from the data lines 7 relatively higher in voltage level than the charge collecting capacitors 5A and 5B. Likewise, to further improve the charge re-using efficiency, it is preferable to move charges accumulated in the charge collecting capacitors 5A and 5B only to the data lines 7 driven to the relatively higher voltage level than the voltages of the charge collecting capacitors 5A and 5B.

Figure 7:
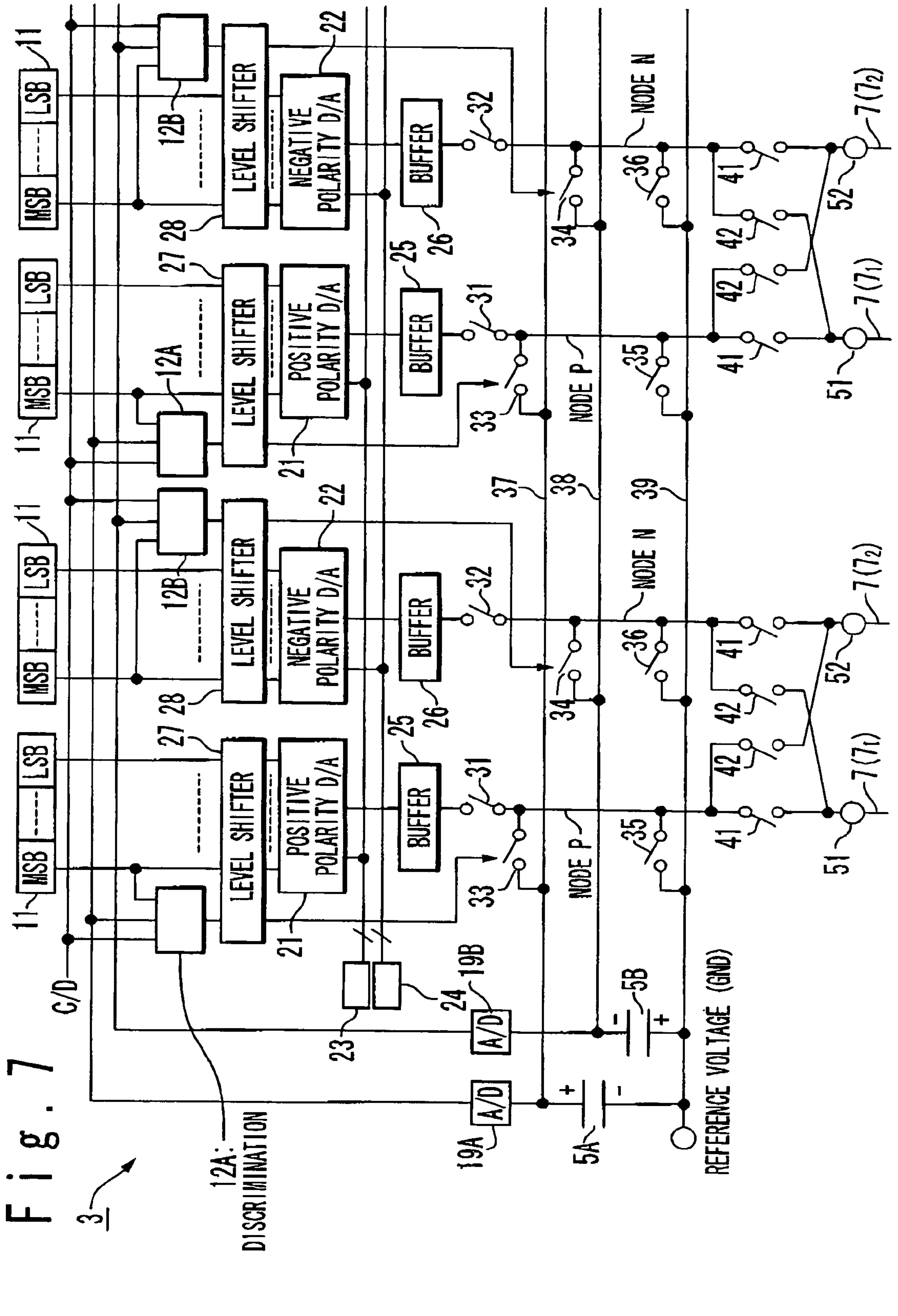
FIG. 7 is a block diagram showing another configuration of the data line driver according to the present embodiment.

The technique for selecting the data lines 7 for the collection and re-using of charges in response to the voltages of the charge collecting capacitors 5A and 5B is effective to improve the charge collection and re-using efficiency FIG. 7 is a block diagram showing the configuration of the data line driver 3 corresponding to this technique. A positive polarity A/D converter circuit 19A is provided between a discriminating circuit 12A involved in generation of the positive polarity data signal and the positive polarity charge collecting capacitor 5A. A negative polarity A/D converter circuit 19B is provided between a discriminating circuit 12B involved in generation of the negative polarity data signal and the negative polarity charge collecting capacitor 5B. The discriminating circuit 12A compares an output of the positive polarity A/D converter circuit 19A with the higher m bits of the pixel data, and turns on or off the corresponding positive polarity collection switch 33 in response to a comparison result. Likewise, the discriminating circuit 12B compares an output of the negative polarity A/D converter circuit 19B with the higher m bits of the pixel data, and turns on or off the corresponding negative polarity collection switch 34 in response to a comparison result.

According to this configuration, for the data lines 7 driven to the positive polarity voltage level, charges are collected only from the data lines 7 having higher voltage levels than a voltage VC of the positive polarity charge collecting capacitor 5A before collection of charges, while no charges are collected from the other data lines 7. Likewise, during the re-using of charges, charges are moved to the data lines 7 driven to the voltage levels higher than a voltage VD of the positive polarity charge collecting capacitor 5A before the re-using of charges, while no charges are moved to the other data lines 7. Further, for the data lines 7 driven to the negative polarity voltage level, charges are collected only from the data lines 7 having lower voltage levels than a voltage VC' of the negative polarity charge collecting capacitor 5B before collection of charges, while no charges are collected from the other data lines 7. Likewise, during the re-using of charges, charges are moved to the data lines 7 driven to the voltage levels lower than a voltage VD' of the negative polarity charge collecting capacitor 5B before the re-using of charges, while no charges are moved to the other data lines 7. This operation can effectively improve the charge collection and re-using efficiency.

In order to further improve the charge collection and re-using efficiency, it is necessary to consider a phenomenon that the voltages of the charge collecting capacitors 5A and 5B are changed after the collection of charges and the re-using of charges. As understood from FIG. 8, the voltages of the charge collecting capacitors 5A and 5B during a period after the collection of charges and before the re-using of charges are changed conspicuously particularly if a ratio of the capacitance value of the charge collecting capacitor 5A to that of the parasitic capacitance of all the data lines 7 is low.

Figure 10:
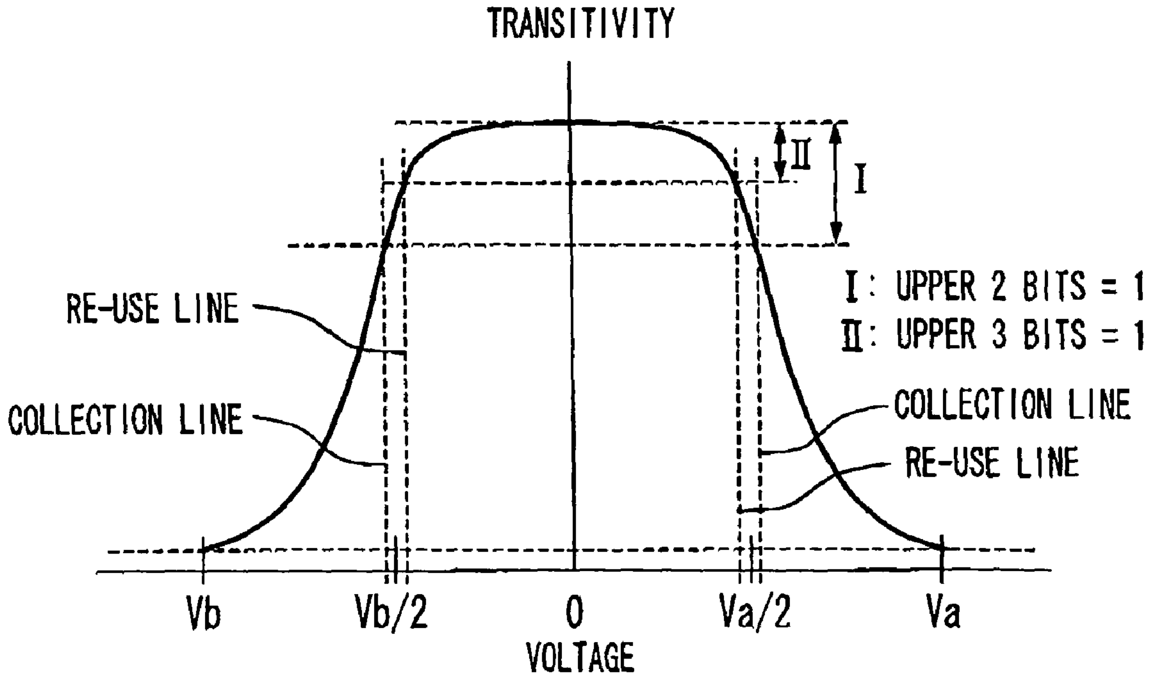
FIG. 10 is a graph showing a collection line and a re-use line.

In order to thus improve the charge collection and re-using efficiency in accordance with the change in the voltages of the charge collecting capacitors 5A and 5B as shown in FIG. 10, a voltage threshold (collection line) for selecting the data lines 7 from which charges are collected is set different from a voltage threshold (re-using line) for selecting the data lines 7 for which charges are re-used. Specifically, for the data lines 7 driven to the positive polarity voltage level, the collection line is preferably higher than the re-using line. For the data lines 7 driven to the negative polarity voltage level, the re-using line is preferably lower than the collection line.

One of the simplest methods for realizing this operation is as follows. The data lines 7 from which charges are collected are selected in response to the higher m bits of the pixel data, and the data lines 7 for which charges are re-used are selected in response to higher n bits (where n>m). It is assumed, for example, that "111111" corresponds to 0V and "000000" corresponds to the highest voltage level for the positive polarity data signal. If the discriminating circuit 12 determines that higher 2 bits of the pixel data are both "1", the charges of the corresponding data line 7 are not collected. If the discriminating circuit 12 determines that higher 3 bits of the pixel data are "1", the charges of the corresponding data line 7 are not re-used. Thus, it is possible to set the collection line higher than the re-using line and to realize more efficient collection and re-using of charges.

In the operation stated above, the collection of charges, the driving of data lines, and the re-using of charges are performed in each horizontal period. However, it is not always necessary to perform all of the collection of charges, the driving of data lines 7, and the re-using of charges in each horizontal period. For instance, the data line driver 3 may operate to perform the ordinary driving of data lines and the collection of charges during a few horizontal periods, and to perform the re-using of charges and the ordinary driving of data lines during a few horizontal periods subsequent to the former horizontal periods.

A technique for exclusively performing the collection of charges and the re-using of charges in each horizontal period is preferably applied to an instance in which a video image is displayed on the normally white LCD panel while a black display frame is inserted between two adjacent normal display frames. The "black display frame" means herein a frame for which all the pixels of the LCD panel display a black image (that is, luminances of all the pixels are lowest). To insert the black display frame is one of the effective techniques for suppressing an image blur when a moving image is displayed on the LCD panel.

Effectiveness of exclusively collecting and re-using charges when the black display frame is inserted results from the fact that the insertion of the black display frame causes an increase in substantial frame frequency. If the black display frame is inserted, the substantial frame frequency is doubled. If the substantial frame frequency is doubled, a situation in which both the collection of charges and the re-using of charges cannot be performed during one horizontal period may possibly occur.

Figure 11:
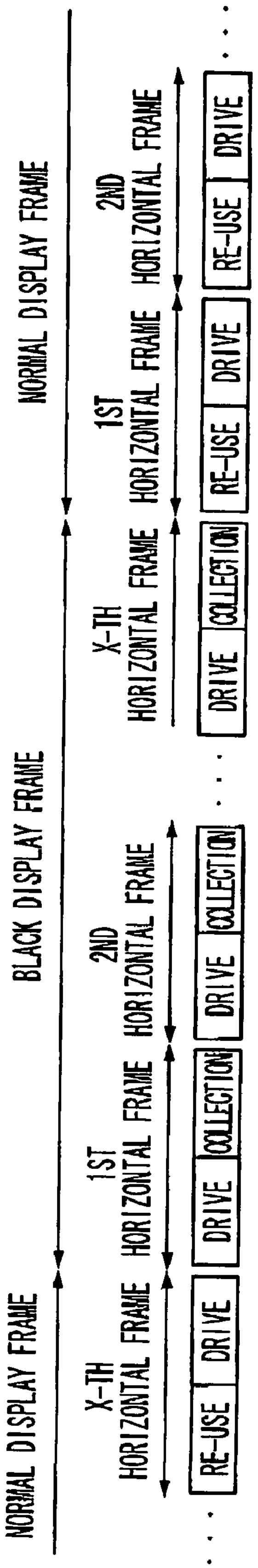
FIG. 11 is a timing chart of an operation of the data line driver.
Figures 12A, 12B, 12C, 12D, 12E, 12F, 12G, 12H, 12I, 12J:
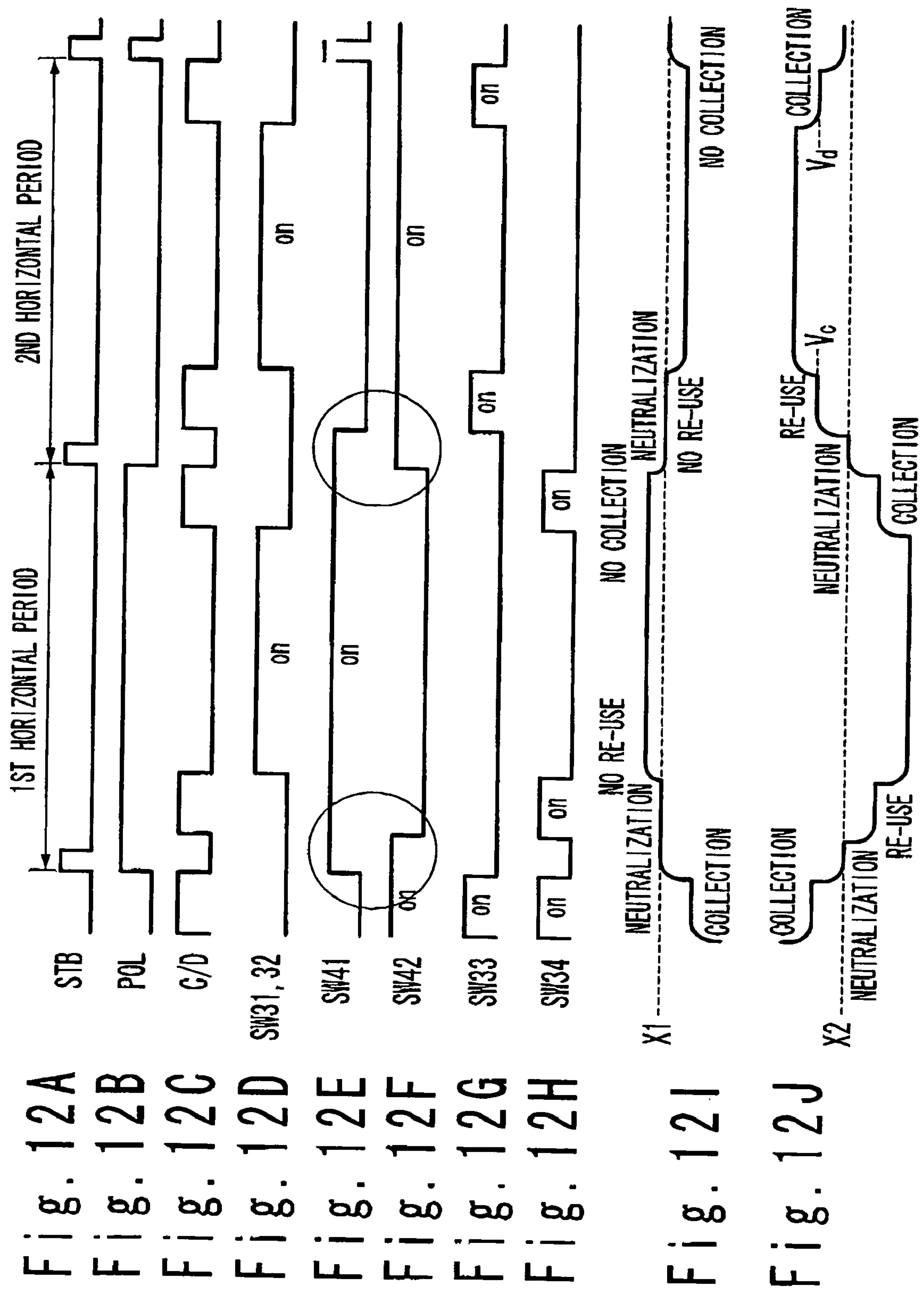
FIGS. 12A to 12J are timing charts showing an operation of the data line driver.

To exclusively perform the collection of charges and the re-using of charges during each horizontal period is effective to avoid the above-described problems. FIG. 11 is a timing chart of a preferable operation of the data line driver 3 if the collection of charges and the re-using of charges are exclusively performed during each horizontal period. In each normal display frame, the re-using of charges and the driving of the data lines 7 are performed but the collection of charges is not performed during each horizontal period. In the black display frame, the driving of the data lines 7 and the collection of charges are performed. If the LCD panel 2 is normally white, then the data lines 7 driven by the positive data signals are driven to the highest voltage level, and those driven by the negative data signals are driven to the lowest voltage level. The operation shown in FIG. 11 is, therefore, preferably capable of collecting more charges into the charge collecting capacitors 5A and 5B.

By collecting the charges of the data lines 7 into the charge collecting capacitors 5A and 5B, the charge collecting capacitors 5A and 5B become substantially equal in absolute value of voltage. For instance, the voltage of the charge collecting capacitor 5A and that of the charge collecting capacitor 5B are changed around 2.5V and −2.5V, respectively, according to the respective image data. This indicates that a neutralizing operation after the collection of charges is performed as shown in FIGS. 12A to 12J. Namely, if the polarity changeover switches 41 and 42 are simultaneously turned on, the charges of the data line connected to the even-number output terminal and those of the data line connected to the odd-number output terminal substantially cancel each other, making the voltages of the respective data lines 7 close to 0V. As already described above, each of the precharge switches 35 and 36 may be the diode. Namely, if each of the collection switch 33 and the precharge switch 35 is formed from an analog switch such as a MOS transistor, a parasitic PN junction is generated between the node P and the ground voltage and functions as a diode. Likewise, if each of the collection switch 34 and the precharge switch 36 is formed from an analog switch, the parasitic PN junction is generated between the node N and the ground voltage and functions as the diode. From these, a voltage equal to or lower than a threshold voltage (e.g., −0.5V) of the diode is not applied to the positive polarity driving circuits, and a voltage equal to or higher than a threshold voltage (e.g., +0.5V) of the diode is not applied to the negative polarity driving circuits. The voltages of the positive polarity driving circuits and the negative polarity driving circuits do not reach their breakdown voltages. Therefore, it is possible to omit the precharge switches 35 and 36 by simultaneously turning on the polarity changeover switches 41 and 42.

The display apparatus has been described so far while applying the present invention to the dot inversion driving (1H1V inversion driving) by way of example. Alternatively, the present invention can be applied to 2H1V inversion driving for inversion-driving the polarity of each data signal for every two scan periods while adjacent data lines are different in polarity, or to V line inversion driving for not performing inversion-driving for every scan period. Further, the display panel may be a display panel of not the normally white liquid crystal display apparatus but a normally black liquid crystal display apparatus or an organic EL display apparatus. In that case, a black image is displayed when the signal level is the lowest and a white image is displayed when the signal level is the highest. Therefore, the display apparatus is configured so that the collection of charges and re-using of charges are performed not for the black display but for the white display.

Moreover, the present invention can be applied not only to the dot inversion driving but also common inversion driving for periodically inverting the common electrode 10. In that case, it is sufficient to determine whether to perform the collection and re-using of charges according to not only the higher bits of the pixel data and the C/D signal but also the polarity signal POL. For instance, if the polarity signal is "1" and the highest bit of the pixel data is "1", the collection and re-using of charges are performed. If the polarity signal is "1" and the highest bit of the pixel data is "0", the collection and re-using of charges is not performed. Further, if the polarity signal is "0" and the highest bit of the pixel data is "0", the collection and re-using of charges is performed. If the polarity signal is "0" and the highest bit of the pixel data is "1", the collection and re-using of charges is not performed.

Furthermore, the components of the data line driver circuit 3 are not necessarily formed on the same substrate. For instance, the changeover switches 41 and 42 may be formed not on the same semiconductor substrate as that on which the data line driver circuit 3 but on a glass substrate on which the pixels 8 are formed. In addition, the charge collecting capacitors 5A and 5B may be integrated within the data line driver 3 without being externally connected to the data line driver 3.

According to the present invention, it is possible to simplify the circuit that selects the data line for which collection and/or re-using of charges are performed while improving the efficiency for the collection and/or the re-using of charges.

What is claimed is:

1. A data line driver which drives a data line of a display panel, comprising:

- a positive polarity driving circuit configured to operate in a first voltage range between a reference voltage and a first voltage greater than said reference voltage to output to a first node, a positive polarity data signal with respect to said reference voltage;
- a negative polarity driving circuit configured to operate in a second voltage range between said reference voltage and a second voltage less than said reference voltage to output to a second node, a negative polarity data signal with respect to said reference voltage;
- a first collection switch provided between said first node and a first collection line;
- a second collection switch provided between said second node and a second collection line; and
- a changeover switch provided between said first and second nodes and between first and second output terminals, to operate in a third voltage range which is from said second voltage to said first voltage,
- wherein electric charges accumulated on said data line are transferred by controlling said first and second collection switches,
- wherein said changeover switch comprises:
  - a first changeover switch provided between said first node and said first output terminal;
  - a second changeover switch provided between said second node and said second output terminal;
  - a third changeover switch provided between said first node and said second output terminal; and
  - a fourth changeover switch provided between said second node and said first output terminal.

2. The data line driver according to claim 1, further comprising:

- first and second precharge switches provided between said reference voltage line and said first and second nodes, respectively.

3. The data line driver according to claim 1, further comprising:

- diode elements provided between said reference voltage line and said first and second nodes, respectively.

4. The data line driver according to claim 1, wherein said reference voltage is a system ground of the display apparatus.

5. The data line driver according to claim 1, wherein said first collection switch operates in said first voltage range, and said second collection switch operates in said second voltage range.

6. The data line driver according to claim 1, wherein said first and second collection switches connect or disconnect said data line to or from said first and second collection lines electrically in response to upper m bits (m<k) of an image data of k bits.

7. The data line driver according to claim 2, wherein said first precharge switch operates in said first voltage range, and said second precharge switch operates in said second voltage range.

8. The data line driver according to claim 1, wherein after said first and second collection switches are turned on to move electric charges accumulated on said data line to said first and second collection lines, said first and second collection switches are turned off and said first to fourth changeover switches are turned on at a same time to neutralize charges on the data line.

9. The data line driver according to claim 1, wherein breakdown voltages of elements of said positive and negative polarity driving circuits are less than those of elements of said changeover switch.

10. The data line driver according to claim 1, wherein thicknesses of gate insulating films of transistors in said positive and negative polarity driving circuits are less than thicknesses of transistors in said changeover switch.

11. The data line driver according to claim 1, wherein gate lengths of transistors in said positive and negative polarity driving circuits are less than those of transistors in said changeover switch.

12. The data line driver according to claim 1, wherein breakdown voltages of elements of said first and second collection switches are less than breakdown voltages of elements of said changeover switch.

13. The data line driver according to claim 1, wherein thicknesses of gate insulating films of transistors in said first and second collection switches are less than those of transistors in said changeover switch.

14. The data line driver according to claim 1, wherein gate lengths of transistors in said first and second collection switches are less than those of transistors in said changeover switch.

* * * * *